(12) United States Patent
Iwasaki et al.

(10) Patent No.: US 6,172,296 B1
(45) Date of Patent: *Jan. 9, 2001

(54) PHOTOVOLTAIC CELL

(75) Inventors: Yukiko Iwasaki; Kozo Arao, both of Nara; Masafumi Sano; Takaharu Kondo, both of Kyoto, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/857,907

(22) Filed: May 16, 1997

(30) Foreign Application Priority Data

May 17, 1996 (JP) .................................................. 8-146541
Jul. 4, 1996 (JP) .................................................. 8-192731

(51) Int. Cl.[7] .................................................. H01L 31/0216
(52) U.S. Cl. .................................................. 136/256; 136/258
(58) Field of Search .................................. 136/255, 256, 136/261, 258, 252

(56) References Cited

U.S. PATENT DOCUMENTS

| | | | | |
|---|---|---|---|---|
| 4,419,533 | * | 12/1983 | Czubatuj et al. | 136/259 |
| 4,532,372 | | 7/1985 | Nath et al. | 136/256 |
| 4,598,306 | | 7/1986 | Nath et al. | 357/30 |
| 5,155,565 | * | 10/1992 | Wenz et al. | 357/30 |
| 5,244,509 | * | 9/1993 | Arao et al. | 136/259 |
| 5,324,365 | * | 6/1994 | Niwa | 136/256 |
| 5,401,330 | * | 3/1995 | Saito et al. | 136/259 |
| 5,453,135 | * | 9/1995 | Nakagawa et al. | 136/259 |
| 5,486,238 | * | 1/1996 | Nakagawa et al. | 136/259 |
| 5,500,055 | * | 3/1996 | Toyama et al. | 136/259 |
| 5,569,332 | * | 10/1996 | Glatfelter et al. | 136/249 |
| 5,584,941 | * | 12/1996 | Nishida | 136/258 |
| 5,824,566 | * | 10/1998 | Sano et al. | 438/69 |
| 5,849,108 | * | 12/1998 | Kariya et al. | 136/265 |

FOREIGN PATENT DOCUMENTS 60-41878    9/1985    (JP) .................................. H01L/31/04

OTHER PUBLICATIONS

Solar Energy Materials, 20, 1990, pp. 99–110, M. Hirasaka et al., "Design of Textured Al Electrode for a Hydrogenated Amorphous Silicon Solar Cell".

* cited by examiner

Primary Examiner—Ellis Robinson
Assistant Examiner—Michael C. Miggins
(74) Attorney, Agent, or Firm—Fitzpatrick, Cella, Harper & Scinto

(57) ABSTRACT

A photovoltaic cell in accordance with the present invention includes at least a metal layer, a semiconductive layer and a transparent electrode formed on a substrate. The metal layer is composed of a metal mainly containing aluminum; and has an x-ray diffraction pattern in which a (111) peak intensity is enhanced to at least 2.1 times a (200) peak intensity, at least 4.4 times a (220) peak intensity and at least 4.1 times a (311) peak intensity.

The metal layer essentially consists of an aluminum-titanium alloy or an aluminum-magnesium alloy. An interlayer may be provided between the metal layer and the substrate.

16 Claims, 15 Drawing Sheets

SPECULAR SURFACE

TEXTURED SURFACE

PHOTOVOLTAIC CELL

BACKGROUND OF THE INVENTION

1. Field of the Invention

The present invention relates to a photovoltaic cell having a high conversion efficiency and reliability, which uses a metal layer free from reflectance reduction at near 800 nm inherent in aluminum. Also, the present invention relates to a photovoltaic cell having improved adhesion between a substrate and a metal layer.

2. Description of the Related Art

Single-crystal and polycrystalline silicon have been primarily used in solar cells. Since fabrication of solar cells consumes much energy and time in the growing step of these silicon crystals and requires complicated succeeding steps, cost reduction due to mass production is hardly achieved. Recently, thin film semiconductor solar cells using compound semiconductors, such as amorphous silicon (hereinafter referred to as a-Si) and CdS·SuInSe$_2$, have been vigorously developed. Since a semiconductive layer can be formed on an inexpensive substrate made of glass, stainless steel or the like according to demand by a relatively simple fabrication process, thin film semiconductor solar cells have advantages in material and production costs. Thin film semiconductor solar cells, however, have lower conversion efficiencies relative to crystal silicon solar cells and lack reliability for long term use. Therefore, they are not used in earnest. Various ideas have been disclosed to improve thin film semiconductor solar cell performance.

One method for such improvement relates to a back metal layer provided on a substrate surface in order to enhance the reflectance of light on the substrate surface and effectively use incident light, in which sunlight not absorbed in the semiconductor thin layer is reflected back towards the semiconductor thin layer so as to be absorbed. Since short wavelength components of incident sunlight have already been absorbed in the semiconductor thin layer, high reflectance is required for longer wavelength components. A critical wavelength for high reflectance depends on the absorption coefficient and thickness of the semiconductor thin layer. When sunlight is incident on the semiconductor thin layer through the substrate side of a transparent substrate, a metallic electrode having high reflectance, e.g. silver (Ag) or copper (Cu), is preferably formed on the semiconductor thin layer surface. FIG. 2 is a graph for comparison of reflectance of Ag, Al, Cu and Ni films each having a thickness of 2,000 Å. When sunlight is incident on the semiconductor thin layer surface, a similar metal layer is preferably formed on the substrate surface before forming the semiconductor thin layer. A transparent conductive layer intercalated between the metal layer and the semiconductor thin layer further enhances the reflectance due to multiple interference effects. Use of the transparent conductive layer also causes increased reliability of thin film solar cells. Japanese Examined Patent Publication No. 60-41,878 discloses that use of a transparent conductive layer can prevent alloying of a semiconductor and metal. U.S. Pat. Nos. 4,532,372 and 4,598,306 disclose that use of a transparent conductive layer having a moderate resistance can prevent excessive current between electrodes when short-circuiting occurs in the semiconductive layer.

Another method for enhancing conversion of thin film solar cells relates to a fine uneven structure or texture of the solar cell surface and/or interface with the back metal layer. With such a texture, sunlight scatters on the solar cell surface and/or interface with the back metal layer, is trapped in the semiconductor (light trapping effect), and thus is effectively absorbed by the semiconductor. When using a transparent substrate, a transparent electrode having a fine uneven texture surface, made of tin dioxide (SnO$_2$) or the like, is preferably formed on the substrate. When sunlight is incident on the thin film semiconductor surface, a back metal layer having a fine uneven textured surface is preferably used. M. Hirasaka et al. discloses that a back metal layer having a fine uneven textured surface can be formed by depositing aluminum under a regulated substrate temperature and deposition rate (Solar Energy Materials 20(1990) p. 99–110). FIG. 3 is a graph illustrating an increase in absorption of incident light due to use of such a textured back metal layer, wherein curve (a) is a graph illustrating spectral sensitivity of an a-SiGe solar cell using specular silver as a metal layer, and curve (b) is a graph illustrating spectral sensitivity of a solar cell using textured silver. FIG. 3 demonstrates that light of near 800 nm is not effectively used in the a-SiGe semiconductive layer, and therefore, use of a back metal layer having high reflectance for light of near 800 nm further enhances conversion. FIG. 2 demonstrates that silver and copper have high reflectance over the entire wavelength region between 700 and 1,000 nm, whereas aluminum has a local minimum reflectance at near 800 nm. Therefore, silver and copper, having high reflectance at 800 nm, are most suitable for the metal layer.

However, it is known that electrochemical migration occurs in these metals and in particular in silver. Electrochemical migration (hereinafter referred to as merely "migration") refers to a phenomenon that occurs when a metallic foil, plating or paste is used in a contact state with a hygroscopic or hydrophilic insulating material in a high humidity environment while applying direct current; the metal forms electrically conductive paths as a result of dendritic or speckled growth of electrolysis products on and in the insulating material. Some metals require additional factors for electrolysis. For example, experimental results illustrate that silver (Ag), copper (Cu) and lead (Pb) require distilled water and an electric field for migration (Ag deposits dendritic crystal at an extremely high rate), gold (Au), palladium (Pd) and indium (In) further require halogen ions, and aluminum (Al), nickel (Ni) and iron (Fe) require special conditions other than the above-mentioned factors.

Interelectrode short-circuiting due to migration is a problem to be solved in solar cells used in various environments for long time periods, for example, a solar cell used outside in a high temperature, high humidity environment. Since a single solar cell has a low output voltage, a plurality of submodules (modulated thin film semiconductor solar cells) connected in series are generally used. When the solar cells are partly covered with fallen leaves, the output current of the covered submodules drastically decreases relative to the uncovered submodules and the internal impedance increases. As a result, an output voltage from uncovered submodules is applied to the covered submodules. A condition causing migration, that is, inverted bias impression at high temperature and high humidity, is established, resulting in interelectrode short-circuiting and submodules breakage. Use of high reflectance Ag or Cu as the back metal layer further promotes such migration. Since Al, highly resistive to migration, has a wavelength region of low reflectance at near 830 nm, use of Al does not achieve high conversion compared to Ag and Cu.

A combination of a back metal layer comprising a metal layer and a transparent conductive layer with a textured structure is also effective. U.S. Pat. No. 4,419,533 discloses a transparent conductive layer formed on a metal layer with a surface textured structure. Formation of a transparent conductive layer with a textured structure on a specular metal layer will also be feasible. Such a combined technique is expected to significantly increase conversion of solar cells.

Adhesion between the substrate and the metal layer deteriorates during use of the photovoltaic cell in a high temperature, high humidity environment, a high chloride environment on the sea or seaside, and a hot temperature environment in a desert. Adhesion between the metal layer and the transparent conductive layer also deteriorates during use of the photovoltaic cell in such environments.

SUMMARY OF THE INVENTION

It is an object of the present invention to provide an inexpensive photovoltaic cell having high efficiency which is achieved by the improvement in reflectance reduction of Al at a wavelength of near 800 nm.

It is another object of the present invention to provide a photovoltaic cell having improved adhesion between a substrate and a metal layer, and excellent weathering resistance.

In accordance with one aspect of the present invention, a photovoltaic cell comprising at least a metal layer, a semiconductive layer and a transparent electrode formed on a substrate, is characterized in that the metal layer comprises a metal mainly containing aluminum and has an x-ray diffraction pattern in which a (111) peak intensity is at least 2.1 times a (200) peak intensity, at least 4.4 times a (220) peak intensity and at least 4.1 times a (311) peak intensity.

Another aspect of the present invention relates to a photovoltaic cell comprising at least a metal layer, a semiconductive layer and a transparent electrode formed on a substrate, the metal layer essentially consisting of an aluminum-titanium alloy, an aluminum-magnesium alloy, or an aluminum-silver alloy.

An interlayer may be provided between the metal layer and the substrate in order to improve adhesion between the metal layer and the substrate and to provide a photovoltaic cell having excellent weather resistance.

A preferable interlayer material is nickel, chromium or titanium. Reflectance and adhesion are further improved by using oxygen, nitrogen or carbon in the interlayer.

DETAILED DESCRIPTION OF THE PREFERRED EMBODIMENTS

The present invention will be described with reference to experiments performed in the process until the present invention as completed.

Figure 1:
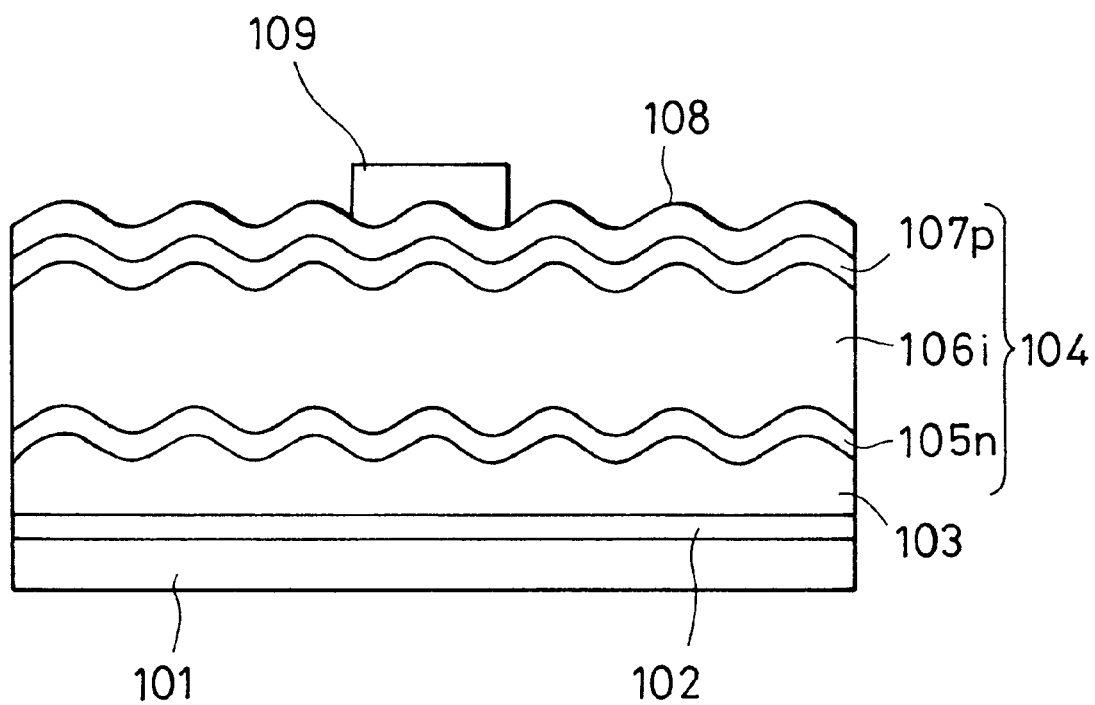
FIG. 1 is a schematic cross-sectional view of a photovoltaic cell in accordance with the present invention.
Figure 2:
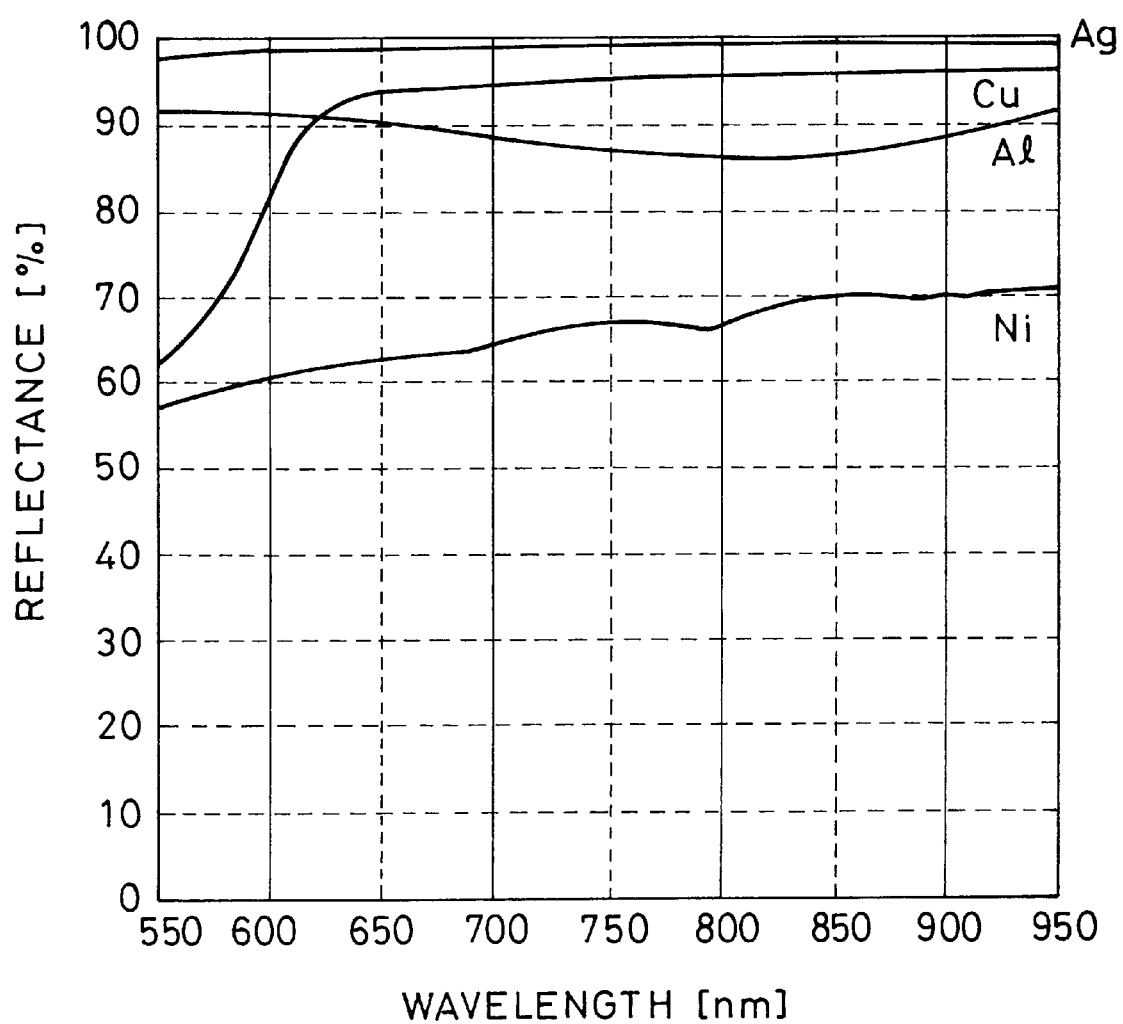
FIG. 2 is a graph illustrating reflectance of Ag, Al, Cu and Ni.
Figure 3A:
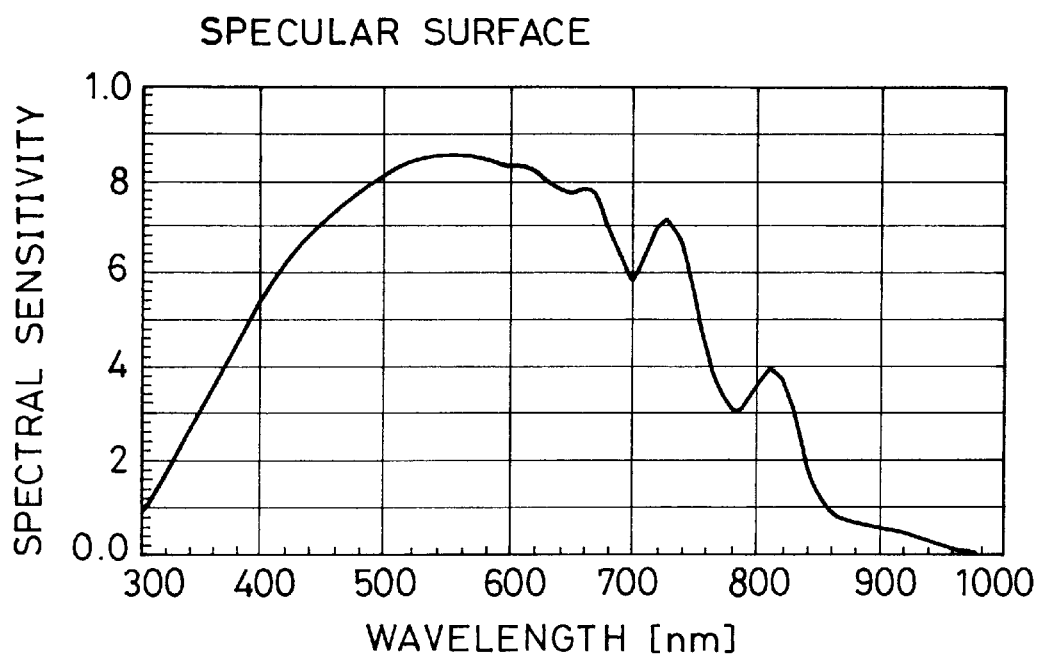
FIGS. 3A and 3B are graphs illustrating increased absorption of incident light in a back metal layer having a textured surface in accordance with the present invention.
Figure 3B:
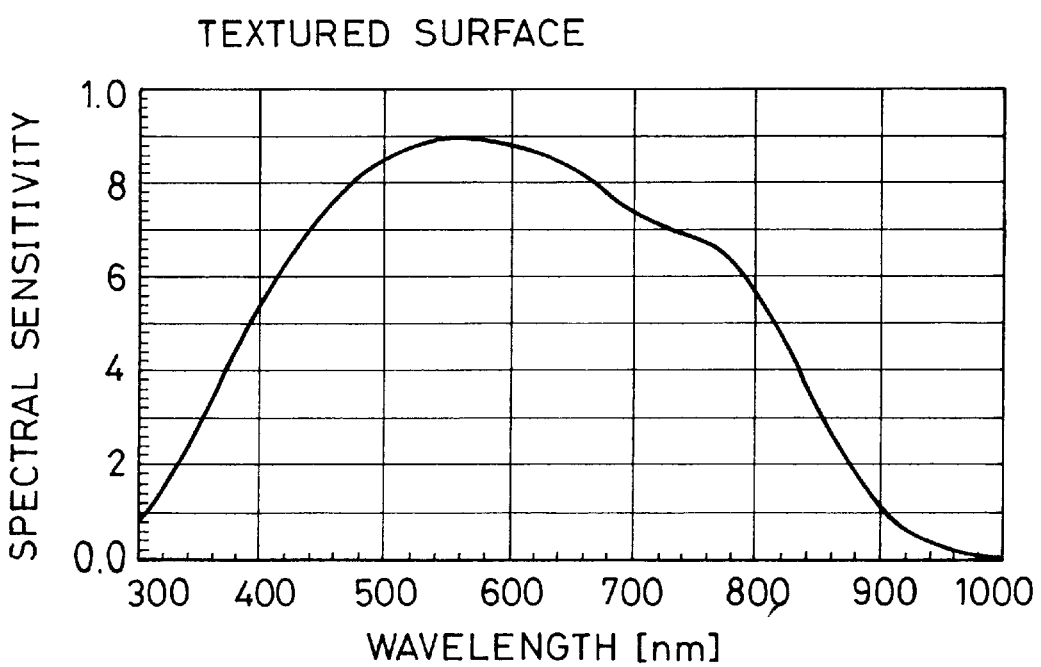

FIG. 1 is a schematic cross-sectional view of a photovoltaic cell in accordance with the present invention. The photovoltaic cell has a substrate 101. The substrate 101 is preferably composed of a conductive metal or a nonconductive material having a metal layer deposited thereon by vacuum evaporation or sputtering. The substrate 101 is provided with a metal layer 102 essentially consisting of Al and a transparent conductive layer 103, and these layers together are referred to as a photovoltaic cell substrate. The transparent conductive layer 103 is transparent to sunlight which passed through a semiconductive layer and has a moderate electric resistance and a textured surface. Numeral 104 represents a thin film semiconductor junction. FIG. 1 illustrates a pin-type a-Si photovoltaic cell as an example of the thin film semiconductor junction. Also, a pin-type a-Si photovoltaic cell may be a tandem structure or a triple structure comprising a laminate of a plurality of photovoltaic cells. The semiconductor junction 104 is composed of an n-type a-Si layer 105, an i-type a-Si layer 106, and a p-type a-Si layer 107. When the semiconductive layer is thin, the entire semiconductive layer has substantially the same textured surface as the transparent conductive layer 103. A transparent electrode 108 and a collecting electrode 109 are provided on the thin film semiconductor junction.

The metal layer 102 of the photovoltaic cell in accordance with the present invention is composed of metal essentially consisting of aluminum and has an x-ray diffraction pattern in which an intensity of peak (111) is higher than 2.1 times that of peak (200), 4.4 times that of peak (220) and 4.1 times that of peak (311). The metal layer characterized as set forth above has the following advantages.

(1) The (111) plain-dominantly oriented film prevents decreased reflectance of 800 nm light, which is inherent in aluminum. Therefore, the incident sunlight is effectively converted to electric energy, resulting in improved conversion of the solar cell. In a stacked cell comprising a plurality of semiconductor junctions, since junctions near the substrate are sensitive to longer wavelengths, the improvement in reflectance of 800 nm light noticeably increases the conversion efficiency.

(2) Use of aluminum having high migration resistance does not cause short-circuiting of the solar cell used in a severe environment and increases reliability of the solar cell.

(3) Use of inexpensive aluminum enables mass production of solar cells at low cost.

Experiments performed by the present inventors will now be described in detail.

Figure 4:
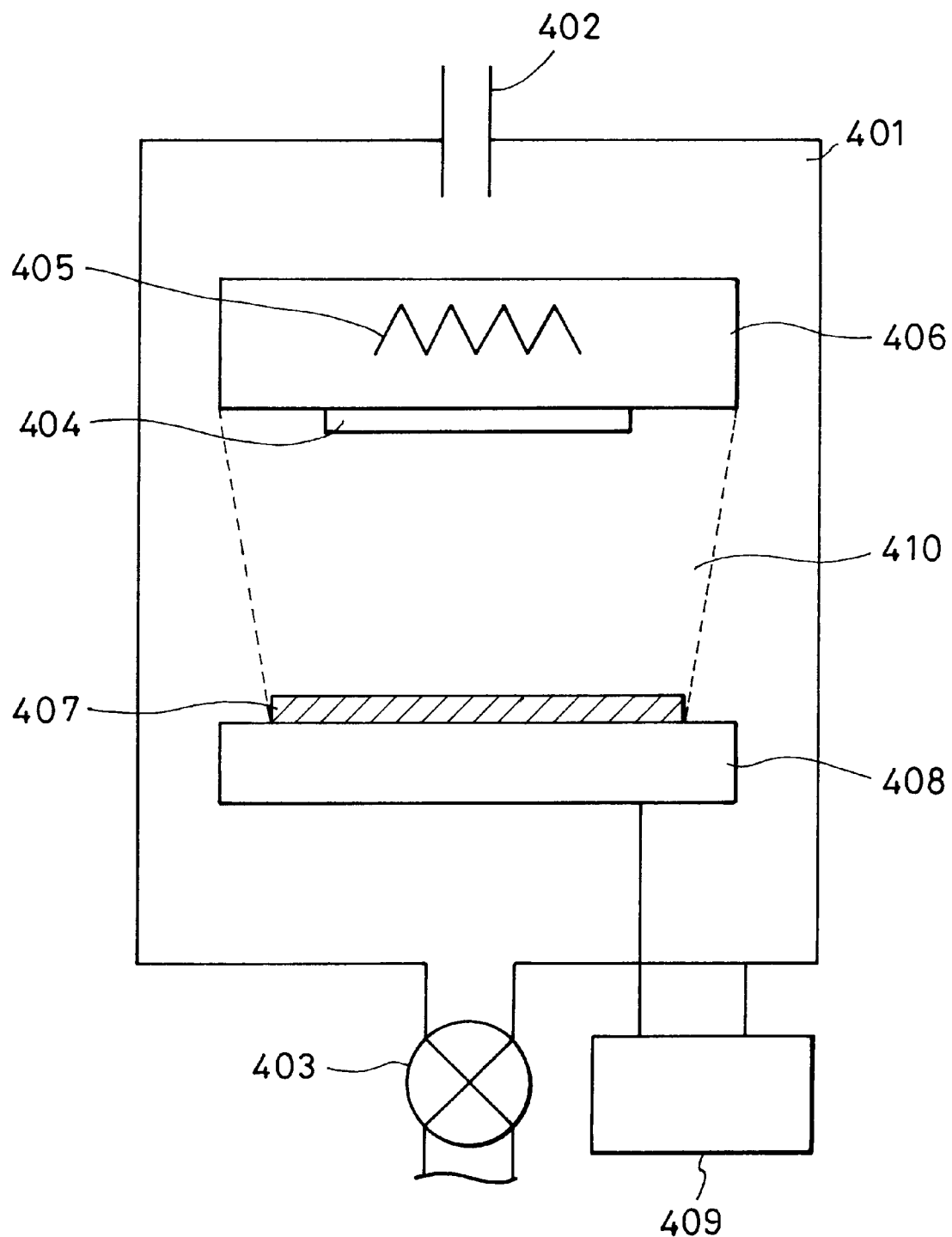
FIG. 4 is a schematic cross-sectional view of a DC magnetron sputtering apparatus in accordance with the present invention.

In the experiments, a metal layer was formed by a DC magnetron sputtering system set forth in FIG. 4. A deposition chamber 401 was evacuated with a pumping system (not shown in the drawing). An inert gas such as argon (Ar) was introduced at a given flow rate through a gas inlet pipe 402 connected to a gas cylinder (not shown in the drawing). The deposition chamber 401 was held at a predetermined pressure by adjusting an exhaust valve 403. A substrate 404 was fixed on the surface of an anode 406 provided with a heater 405 therein. A cathode 408 was provided opposite to the anode 406, and a target 407 is fixed on the cathode 408. The target 407 was composed of a metal block having a purity of 99.9% to 99.999% and was used for deposition. The cathode 408 is connected to a DC power source 409, which applied a high DC voltage to generate plasma 410 between the anode 406 and cathode 408. Metal atoms of the target 407 were deposited on the substrate 404 by means of the plasma 410. Use of a magnetron sputtering system provided with a magnet inside the cathode 408 could further increase the deposition rate.

[Experiment 1: Addition of Titanium]

Samples 1a, 1b, 1c, 1d and 1e were prepared by depositing Al—Ti alloys containing 0.5, 2, 4, 5 and 6 atomic percent of Ti at a thickness of 7,500 Å on a mirror-polished glass plate 7059 made by Corning Incorporated by DC magnetron sputtering. A Ti chip having a purity of 99.999% and a size of 5 mm by 5 mm by 1 mm was placed on the Al target so as to achieve the given compositions in Samples 1a through 1e. Sample 1f having a pure aluminum film was prepared using Al having a purity of 99.999% as a target in the same manner for comparison. Since these films were deposited at a rate of 40 Å/sec at room temperature on a specular substrate, the surface of the deposited film was also specular. All the samples other than Sample 1f were analyzed with an energy dispersion x-ray micro analyzer (XMA) to determine their compositions.

Figure 5:
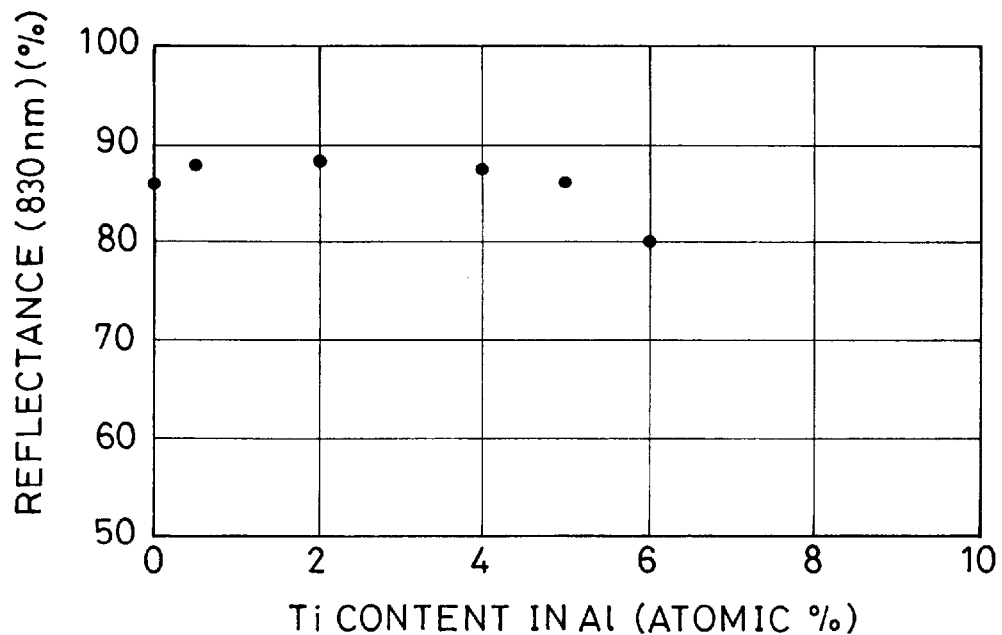
FIG. 5 is a graph illustrating reflectance from Experiment 1 in accordance with the present invention.

Reflectance of these samples over a wavelength range from 400 to 1,200 nm was determined. Since Al has a local minimum reflectance at 830 nm, these samples were compared using reflectance at 830 nm as typical values. Results set forth in FIG. 5 demonstrate that the reflectance of the Al—Ti film at 830 nm is improved by addition of a trace amount of Ti, and particularly 2% of Ti.

Figure 6:
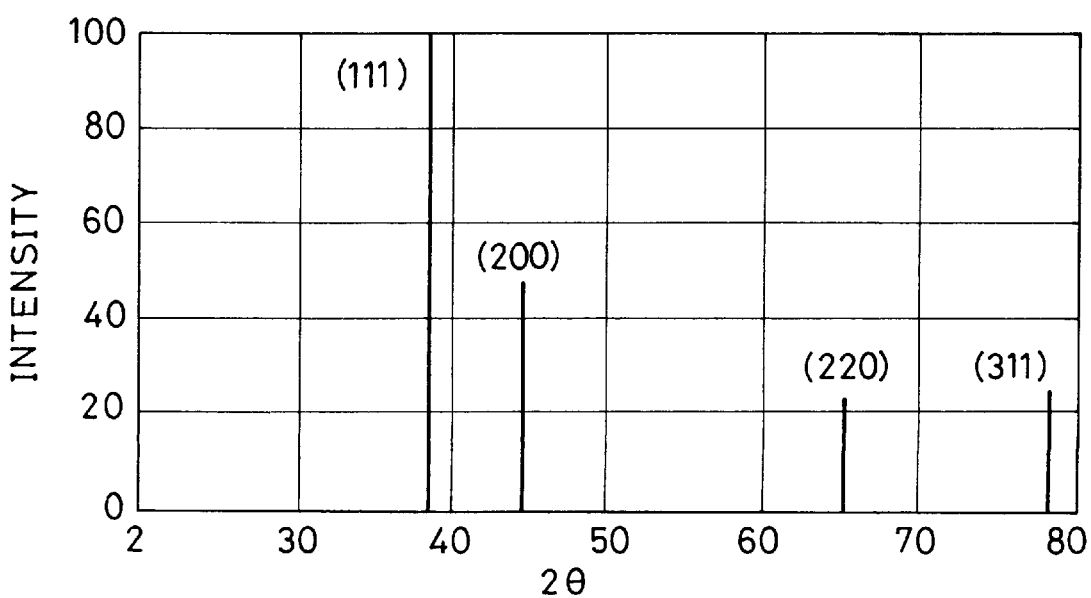
FIG. 6 is an x-ray diffraction pattern from Experiment 1 in accordance with the present invention.

Based on the hypothesis that a trace amount of additive changes the crystal structure or crystal orientation of the metal film, sample 1b containing 2 atomic percent of Ti, which exhibited the most improved reflectance, and sample 1f of pure aluminum were subjected to x-ray diffractometry. FIG. 6 is a diffraction pattern of a powdered Al sample. If all crystal plains are uniformly present in the aluminum film having a face centered cubic crystal structure, diffraction peaks have characteristic intensity ratios, that is, the intensity of the (111) peak is approximately 2.1 times that of the (200) peak, approximately 4.4 times that of the (220) peak, and approximately 4.1 times that of the (311) peak, as set forth in FIG. 6. Therefore, when any one of these peaks has a higher intensity than the above, the related plane is dominantly oriented.

In a diffraction pattern of Sample 1f (not containing Ti), the intensity of the (111) peak is approximately 0.9 times that of the (200) peak and approximately 0.86 times that of the (220) peak. That illustrates that (111) plain is not dominantly oriented. In contrast, a diffraction pattern of Sample 1b (containing Ti) has a strong (111) peak which is approximately 4 times that of the (200) peak and no (220) and (311) peaks. The diffraction angle of each peak in Sample 1b agrees with that in FIG. 6, suggesting no crystal structure change. Therefore, the results suggest that Sample 1b has a predominantly oriented (111) plane.

[Experiment 2: Addition of Magnesium]

Figure 8:
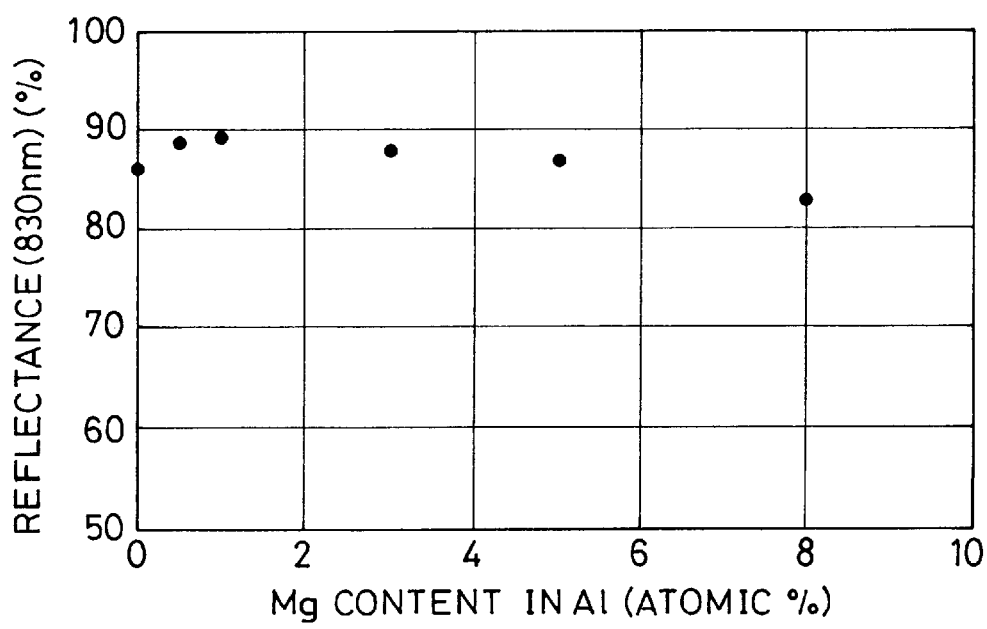
FIG. 8 is a graph illustrating reflectance from Experiment 2 in accordance with the present invention.

Samples 2a, 2b, 2c, 2d and 2e were prepared by depositing Al—Mg alloys containing 0.5, 1, 3, 5 and 8 atomic percent of Mg at a thickness of 7,500 Å on the mirror-polished glass plate set forth in Experiment 1 by the same process as in Experiment 1. Reflectance of these samples over a wavelength range from 400 to 1,200 nm was determined. Reflectance at 830 nm as a typical value is set forth in FIG. 8. FIG. 8 demonstrates that the reflectance of the Al—Mg film at 830 nm is improved by addition of 5 atomic percent or less of Mg as in the case of the addition of Ti. A diffraction pattern of Sample 2b has a strong (111) peak which is approximately 3.6 times that of the (200) peak and no (220) and (311) peaks, suggesting predominant orientation of the (111) plane.

[Experiment 3: Addition of Silver]

Figure 7:
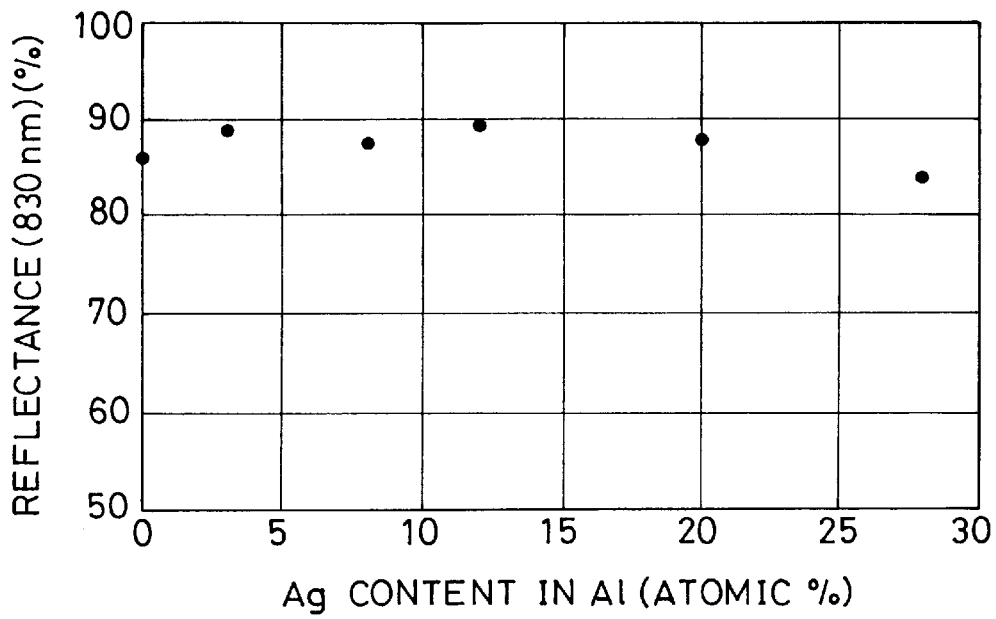
FIG. 7 is a graph illustrating reflectance from Experiment 3 in accordance with the present invention.

Samples 3a, 3b, 3c, 3d and 3e were prepared by depositing Al—Ag alloys containing 3, 8, 12, 20 and 28 atomic percent of Ag at a thickness of 7,500 Å on the mirror-polished glass plate set forth in Experiment 1 by the same process as in Experiment 1. Sample 3f having a pure Ag film was also prepared for comparison. Reflectance of these samples over a wavelength range from 400 to 1,200 nm was determined. Reflectance at 830 nm as a typical value is set forth in FIG. 7. FIG. 7 demonstrates that the reflectance of the Al—Ag film at 830 nm is improved as in the case of the Al—Ti film and exhibits a maximum value at near 10 atomic percent of Ag. Preferably, the Ag content is 25 atomic percent or less. A diffraction pattern of Sample 3d containing 12 atomic percent of Ag has a unique (111) peak at the same angle 2θ as the (111) peak in Sample 1b, suggesting predominant orientation of the (111) plane.

[Experiment 4: Addition of Gold]

Figure 9:
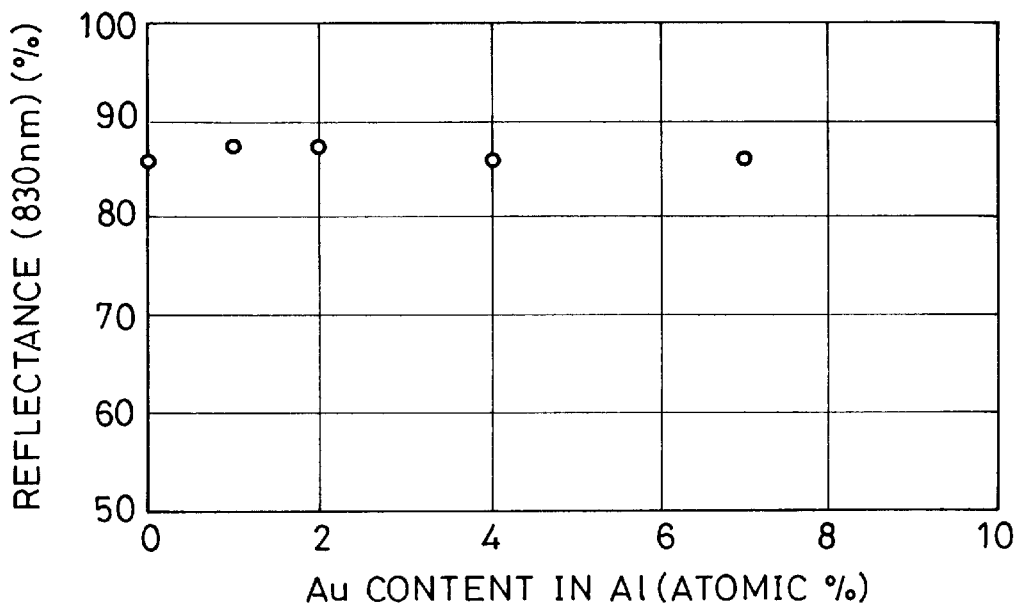
FIG. 9 is a graph illustrating reflectance from Experiment 4 in accordance with the present invention.

Samples 4a, 4b, 4c and 4d were prepared by depositing Al—Au alloys containing 1, 2, 4 and 7 atomic percent of Au at a thickness of 7,500 Å on the mirror-polished glass plate set forth in Experiment 1 by the same process as in Experiment 1. Reflectance of these samples over a wavelength range from 400 to 1,200 nm was determined. Reflectance at 830 nm as a typical value is set forth in FIG. 9. FIG. 9 demonstrates that the reflectance of the Al—Au film at 830 nm is not substantially improved by addition of gold. A diffraction pattern of Sample 4c containing 4 atomic percent of Au has a (111) peak which is twice that of the (220) peak, and predominant orientation of the (111) plane was not confirmed.

Experimental results set forth above demonstrate that reflectance at near 830 nm is improved when the (111) plane of aluminum crystals is dominantly oriented in a metal essentially consisting of Al. Such (111) plane orientation in the Al film is promoted by addition of a moderate amount of a suitable metal, such as Ti, Mg and Al, compared to the pure Al film.

[Experiment 5: Application to Photovoltaic Cell]

As in Experiment 1, metal layers of Al—Ti (2 atomic percent), Al—Ti (6 atomic percent), Al—Ag (12 atomic percent), Al—Ag (40 atomic percent), Al—Mg (1 atomic percent) and Al—Mg (6 atomic percent) were deposited on stainless steel plates having a size of 5 cm by 5 cm, respectively, then a ZnO transparent conductive layer was deposited thereon to a thickness of 10,000 Å. Then, by glow discharge decomposition, an n-type a-Si layer of 200 Å was deposited using $SiH_4$ and $PH_3$ material gases, an i-type a-Si layer of 4,000 Å was deposited using a $SiH_4$ material gas, and a p-type crystallite ($\mu c$) Si layer of 100 Å was deposited using $SiH_4$, $BF_3$ and $H_2$ material gases on each sample to form a thin film semiconductor junction. Further, an indium tin oxide film (ITO film) of 650 Å was deposited thereon by resistance heated evaporation, and a collective electrode with a width of 300 microns was formed with a Ag paste to form a solar cell. Samples 5a and 5b (containing Ti), 5c and 5d Ag), and 5e and 5f (containing Mg) were prepared in such a manner. For comparison, Samples 5g and 5h having a pure Al layer and a pure Ag layer, respectively were prepared.

A photocurrent (Jsc) of each sample was determined with a solar simulator of AM-1.5. Sample 5g (pure Al) had a photocurrent of 16.7 $mA/cm^2$, and Sample 5h (pure Ag) had a photocurrent of 17.8 $mA/cm^2$. Sample 5a (Al-2 at.% Ti) had a photocurrent of 17.2 $mA/cm^2$, Sample 5c (Al-12 at.% Ag) had a photocurrent of 17.4 $mA/cm^2$, and Sample 5e (Al-1 at.% Mg) had a photocurrent of 17.1 $mA/cm^2$. These currents are comparable to that of the solar cell having a pure Ag layer. In contrast, Sample 5b (Al-6 at.% Ti), Sample 5d (Al-40 at.% Ag) and Sample 5f (Al-6 at.% Mg) had currents of 16.3 $mA/cm^2$, 16.0 $mA/cm^2$, and 16.6 $mA/cm^2$, respectively, lower than that of the solar cell having a pure Al layer.

[Experiment 6: Reliability Test]

Figure 10:
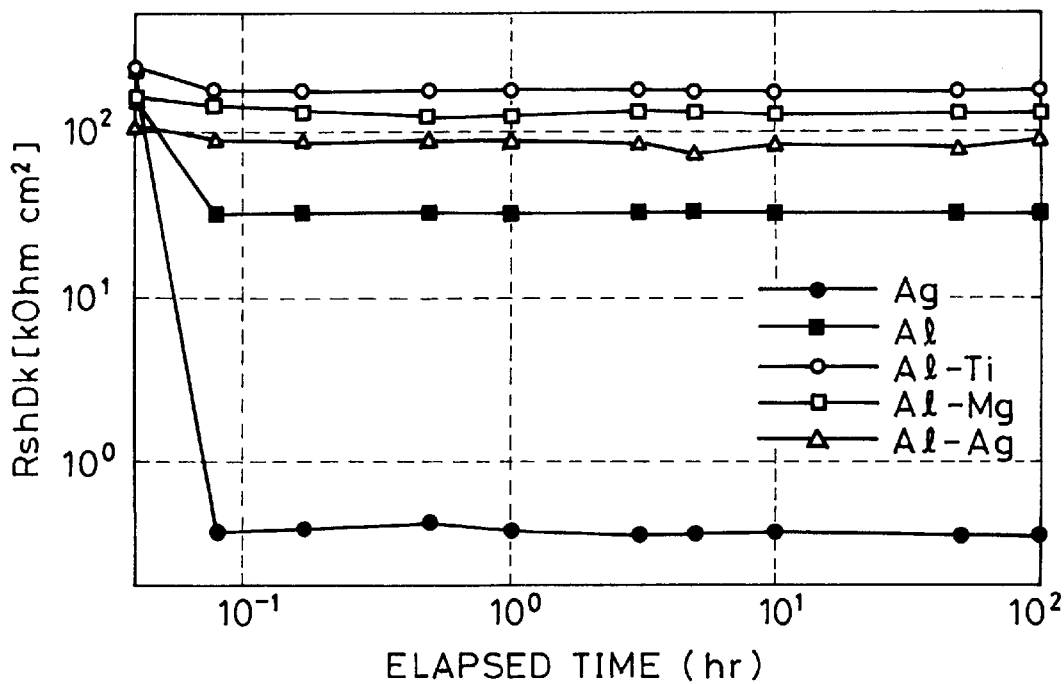
FIG. 10 is a graph illustrating shunt resistance of a dark (RshDk) in Experiment 6.

Five samples among the 8 samples prepared in Experiment 6 were used for a reliability test. A reverse voltage of 0.85 V was applied to each sample at a humidity of 85% and an ambient temperature of 85° C. in the dark (high-temperature, high-humidity reverse bias test), and change in RshDk (shunt resistance in the dark) with elapsed time was observed. Results are set forth in FIG. 10. A RshDk value of 10 $k\Omega cm^2$ or less represents no open-circuit voltage under a low light level which causes problematic characteristics and low reliability of solar cells. Therefore, a critical value of the high-temperature, high-humidity reverse bias test was set to be RshDk $\leq$10 $k\Omega cm^2$. In Sample 5h (pure Ag), RshDk drastically decreased to less than $k\Omega cm^2$ at an initial stage of the test. Sample 5g (pure Al) had a RshDk value higher than 31 $k\Omega cm^2$. In samples 5a (containing Ti), 5c (containing Ag) and 5e (containing Mg), decrease in RshDk was not observed.

A back metal layer used in the thin film semiconductor solar cell in accordance with the present invention will now be described in detail.

(Substrate)

Various metals can be used as a substrate material. Preferable metal materials include stainless steel sheets, galvanized steel sheets, aluminum sheets and copper sheets in view of low material costs. These sheets may be used by cutting into a given shape, or as long sheets depending on the thickness. Long sheets which can be coiled are preferable for continuous production of solar cells and can be easily handled during storage and transportation. Crystal substrates such as silicon substrates, glass and ceramic plates can also be employed according to demand. The surface of the substrate may be polished, or used as it is if the surface is finely finished such as a bright-annealed stainless steel substrate. Alternatively, the substrate surface may be uneven.

(Metal layer)

A metal layer in accordance with the present invention essentially consists of aluminum and contains titanium, magnesium or silver, in order to prevent decrease in reflectance at 830 nm which is inherent in aluminum.

When an aluminum metal layer containing titanium or magnesium is formed on a stainless steel substrate, an interlayer is preferably formed from nickel, chromium or titanium or an alloy thereof which contains at least one element selected from C, O, and N in order to achieve secure adhesion between the interlayer and the metal layer.

The thickness of the metal layer preferably ranges from 0.015 $\mu$m to 1.5 $\mu$m. A thickness of less than 0.015 $\mu$m causes decreased reflectance of sunlight and peeling of the metal layer due to film distortion, whereas a thickness over 1.5 $\mu$m also causes peeling of the metal layer.

When using an aluminum-titanium alloy as the metal layer, a preferable titanium content in the alloy ranges from 0.2 percent by weight to 40 percent by weight. A titanium content of less than 0.2 percent by weight causes intergranular diffusion of aluminum in hot temperatures, whereas a titanium content over 40 percent by weight decreases reflectance of sunlight.

When using an aluminum-magnesium alloy as the metal layer, a preferable magnesium content in the alloy ranges from 0.5 percent by weight to 40 percent by weight. A magnesium content of less than 0.5 percent by weight unsatisfactorily improves pit corrosion resistance in a chloride ion enriched environment, whereas a magnesium content over 40 percent by weight decreases corrosion resistance due to stress corrosion and intergranular corrosion.

The metal layer can be formed by vacuum evaporation, electron beam evaporation, or sputtering. The metal layer must be formed so as not to be a resistive component to the output of the photovoltaic cell. Therefore, the metal layer preferably has a resistance of 50 $\Omega$ or less, and more preferably 10 $\Omega$ or less.

(Interlayer)

An interlayer is provided between the substrate and the metal layer to improve adhesion between them. Examples of interlayer materials include metals, such as nickel, chromium and titanium, and alloys thereof, but are not limited to these. The interlayer can be formed by vacuum evaporation, electron beam evaporation, or sputtering using one of these metals and alloys.

When stainless steel is used as the substrate and an aluminum-magnesium or aluminum-titanium alloy is used as the metal layer, the interlayer, which is formed of nickel, chromium, titanium or an alloy thereof, preferably contains at least one element selected from C, O and N, in order to achieve secure adhesion between the interlayer and the metal layer. Further, such an interlayer can decrease distortion of the substrate and the metal layer and distortion of a transparent conductive layer when provided, and thus can decrease strain of the photovoltaic cell.

As a result, the photovoltaic cell barely causes film peeling off during a bending adhesion test after exposure to a high-temperature, high humidity environment or dipping in sea water, and barely causes electromigration during a hot deterioration test. Therefore, the photovoltaic cell having excellent durability and high environmental resistance achieves a stable, high conversion efficiency.

A preferable thickness of the interlayer ranges from 0.03 $\mu$m to 2 $\mu$m. A thickness of less than 0.03 $\mu$m causes ready peeling of the interlayer due to film distortion, whereas a thickness over 2 μm also causes ready peeling off.

A preferable content of the element selected from C, O and N in the interlayer ranges from 10 to 10,000 ppm. A content of less than 10 ppm causes slight decrease in adhesion to the substrate or the metal layer, whereas a content over 10,000 ppm also causes decreased adhesion to the substrate and the metal layer due to decreased interlayer toughness and decreased reflectance of the metal layer.
(Transparent Conductive Layer and its Textured Surface)

Examples of materials which are frequently used in transparent conductive layers include oxides such as ZnO, $In_2O_3$, $SnO_2$, $CdSnO_4$ and TiO, wherein these chemical formulae do not always represent their actual stoichiometric ratios in the films. Although a higher light transmittance of the transparent conductive layer is generally preferred, it is not necessary to be transparent to light which can be absorbed in the thin film semiconductor. It is preferable that the transparent conductive layer have an appropriate resistance in order to reduce current due to pinholes and the like. On the other hand, series resistance loss due to resistance must be set within a range which does not adversely affect conversion of the solar cell. Therefore, a preferable resistivity per unit area (1 $cm^2$) ranges from $10^{-6}$ Ω to 10 Ω, more preferably $10^{-5}$ Ω to 3 Ω, and most preferably $10^{-4}$ Ω to 1 Ω. The transparent conductive layer requires an average thickness of at least 1,000 Å to achieve a textured surface, although a lower thickness is preferable in view of transparency. A higher thickness will be occasionally required in view of reliability.

The transparent conductive layer can be deposited by vacuum deposition by means of resistance heating and electron beams, sputtering, ion plating, CVD or spray coating. A sputtering system set forth in FIG. 4 is also applicable to transparent conductive layer deposition. Both a metal oxide and a metal, e.g., Zn or Sn, are used as a target. When using a metal, oxygen, as well as Ar, must be introduced into the deposition chamber (this process is called reactive sputtering).

A reason for light trapping is that light scatters in the metal layer having a textured surface. When the thin film semiconductor also has a textured surface, light scattering is enhanced due to phase differences in the light, and the light trapping effect is thereby further increased.

An appropriate impurity may be added for controlling resistivity of the transparent conductive layer. In the conductive oxides set forth above, the resistivity is rather low as a transparent conductive layer. Therefore, an impurity to moderately increase resistivity of the transparent conductive layer is preferable. For example, an acceptor-type impurity is added to a transparent conductive layer of an n-type semiconductor in an appropriate amount to convert to an intrinsic semiconductor having higher resistivity (e.g., Cu for ZnO or Al for $SnO_2$). Further, addition of an impurity will improve chemical resistance. Addition of an impurity to the transparent film can be achieved by addition of the impurity to an evaporation source or a target, or placing a small piece of material containing the impurity on the target in a sputtering process.

[EXAMPLES]

The present invention will now be described with reference to Examples in detail, but is not limited to these Examples.

Example 1

Figure 15:
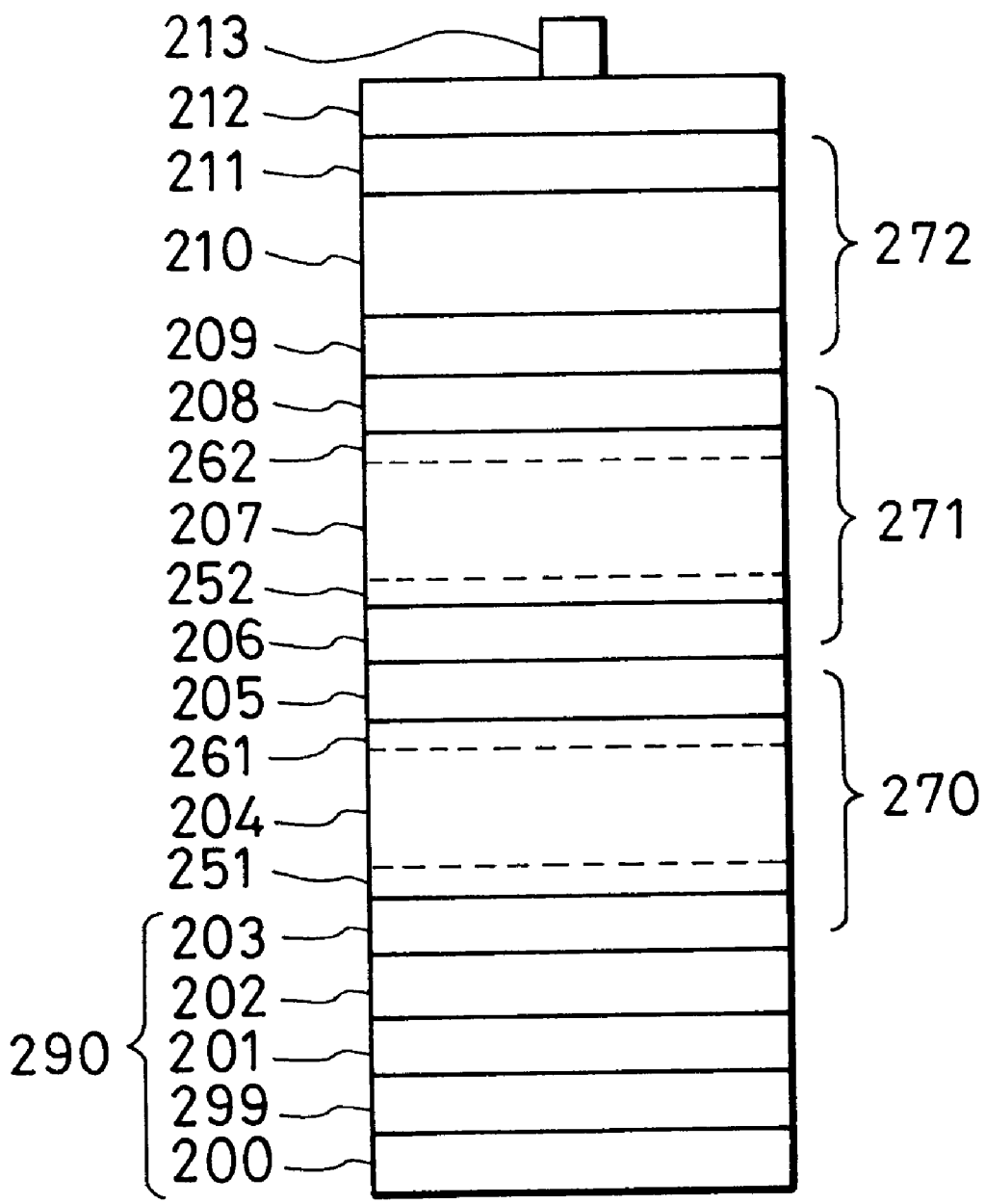
FIG. 15 is a schematic cross-sectional view of a triple solar cell in accordance with the present invention.

FIG. 15 is a schematic cross-sectional view of a photovoltaic cell in accordance with the present invention. An interlayer 299, a metal layer 201 and a transparent conductive layer 202 are separately deposited on a substrate 200. Also, a bottom cell 270, a middle cell 271 and a top cell 272, which comprise a pin junction, are deposited thereon. Further, a transparent electrode 212 and a collective electrode 213 are provided thereon. The interlayer is composed of nickel, the metal layer is composed of AlMg, and the transparent conductive layer is composed of ZnO.

Figure 16:
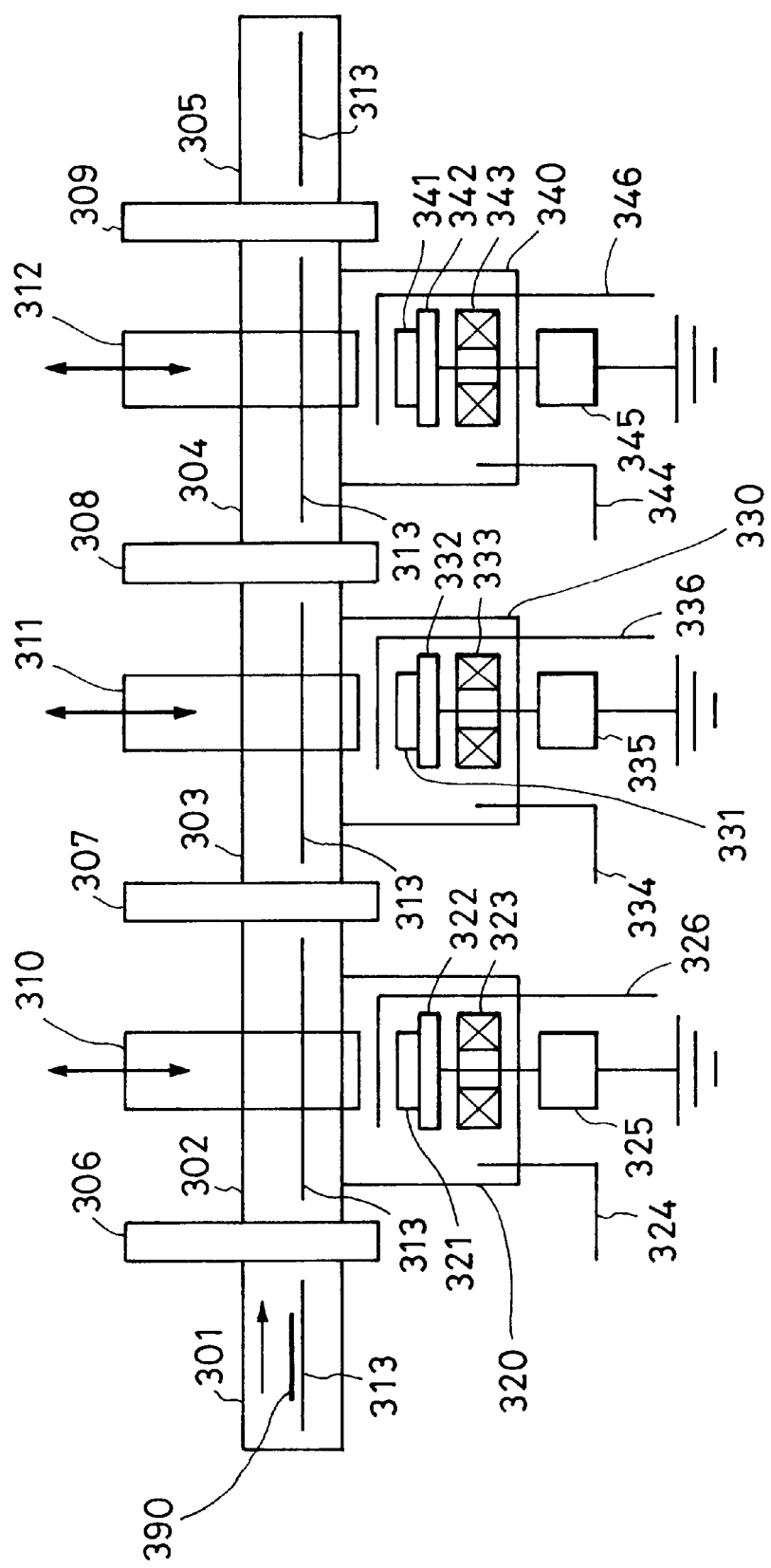
FIG. 16 is a block diagram of a multi-chamber type magnetron sputtering system in accordance with the present invention.

FIG. 16 is a schematic view of a magnetron sputtering system for separately depositing the interlayer, metal layer, and transparent layer. An interlayer deposition chamber 320, a metal layer deposition chamber 330, and a transparent conductive layer deposition chamber 340 are connected to their respective material gas supplying systems (not shown in the drawing) through gas inlet pipes 324, 334 and 344, respectively. All material gases employed are purified to an ultra-high purity. The material gas supplying systems include a $H_2$ gas cylinder, a $N_2$ gas cylinder, an $O_2$ gas cylinder, a $CH_4$ gas cylinder, an Ar gas cylinder, a He gas cylinder, a 1% $N_2$ in Ar gas cylinder, a 1% $CH_4$ in Ar gas cylinder and a 1% $O_2$ in Ar gas cylinder. A target 321 is composed of Ni, a target 331 is composed of AlMg (Mg: 10 percent by weight), and a target 341 is composed of ZnO. These targets are applicable to vacuum sputtering.

A stainless sheet having a thickness of 0.5 mm and an area of 50 mm by 50 mm as a substrate 390 was subjected to ultrasonic cleaning using acetone and isopropyl alcohol and dried in warm air. A DC sputtering power source 325 was connected to a magnetron sputtering system to form a Ni interlayer 299 by DC magnetron sputtering.

First, the substrate 390 after washing was loaded on substrate transferring rails 313 in a load-lock chamber 301, and then the load-lock chamber 301 was evacuated to approximately $1\times10^{-5}$ Torr. Then, a gate valve 306 was opened and the substrate 390 was transferred to the interlayer deposition chamber 320 through a transfer chamber 302, wherein these chambers have been previously evacuated by vacuum evacuation pumps (not shown in the drawing). The back surface of the substrate 390 was brought into close contact with a substrate heater 310 and heated to 300° C., then the interlayer deposition chamber 320 was evacuated to approximately $3\times10^{-6}$ Torr with a vacuum evacuating pump (not shown in the drawing).

Ar gas and $N_2$ in Ar gas were introduced through the gas inlet pipe 324 at flow rates of 36 sccm and 4 sccm, respectively, while adjusting the chamber pressure to 4 mTorr with a conductance valve (not shown in the drawing). A 380 V DC voltage was applied through the sputtering power source 325 to generate Ar plasma. Next, the target shutter 326 was opened to form a Ni interlayer 299 on the substrate 390. When the thickness of the interlayer 299 reached 0.05 μm, the target shutter 326 was closed to extinguish the plasma.

Next, the substrate heater 310 was put away and the substrate 390 was cooled to 100° C. or less in a He gas environment. The cooled substrate 390 was transferred to the metal layer deposition chamber 330 through a transfer chamber 303 by opening a gate valve 307, wherein these chambers have been previously evacuated by vacuum evacuating pumps (not shown in the drawing). The back surface of the substrate 390 was brought into close contact with a substrate heater 311 and heated to 200° C., then the metal layer deposition chamber 330 was evacuated to approximately $2\times10^{-6}$ Torr with a vacuum evacuating pump (not shown in the drawing).

Ar gas was introduced through the gas inlet pipe 334 at a flow rate of 45 sccm, while adjusting the chamber pressure to 4 mTorr with a conductance valve (not shown in the drawing). A 380 V DC voltage was applied through the sputtering power source 335 to generate Ar plasma. Next, the target shutter 336 was opened to form an Al—Mg (90:10) metal layer 201 on the interlayer 299. When the thickness of the metal layer 201 reached 0.5 $\mu$m, the target shutter 336 was closed to extinguish the plasma.

Next, the substrate heater 311 was put away and the substrate 390 was cooled to 100° C. or less in a He gas environment. The cooled substrate 390 was transferred to the transparent conductive layer deposition chamber 340 through a transfer chamber 304 by opening a gate valve 308, wherein these chambers have been previously evacuated by vacuum evacuating pumps (not shown in the drawing). The back surface of the substrate 390 was brought into close contact with a substrate heater 312 and heated to 290° C., then the transparent conductive layer deposition chamber 340 was evacuated to approximately $3 \times 10^{-6}$ Torr with a vacuum evacuating pump (not shown in the drawing).

Ar gas was introduced through the gas inlet pipe 344 at a flow rate of 45 sccm, while adjusting the chamber pressure to 4 mTorr with a conductance valve (not shown in the drawing). A 385 V DC voltage was applied through the sputtering power source 345 to generate Ar plasma. Next, the target shutter 346 was opened to form a ZnO transparent conductive layer 202 on the Al—Mg (90:10) metal layer 201. When the thickness of the transparent conductive layer 202 reached 1.2 $\mu$m, the target shutter 346 was closed to extinguish the plasma.

Next, the substrate heater 312 was put away and the substrate 390 was cooled to 100° C. or less in a He gas environment. The cooled substrate 390 was transferred to an unload-lock chamber 305 by opening a gate valve 309, wherein the unload-lock chamber has been previously evacuated by vacuum evacuating pumps (not shown in the drawing).

A photovoltaic cell substrate SEx1 in accordance with the present invention was prepared by such a process. The Ni interlayer 299 of the photovoltaic cell substrate (SEx1) contained 500 ppm of N.

Figure 17:
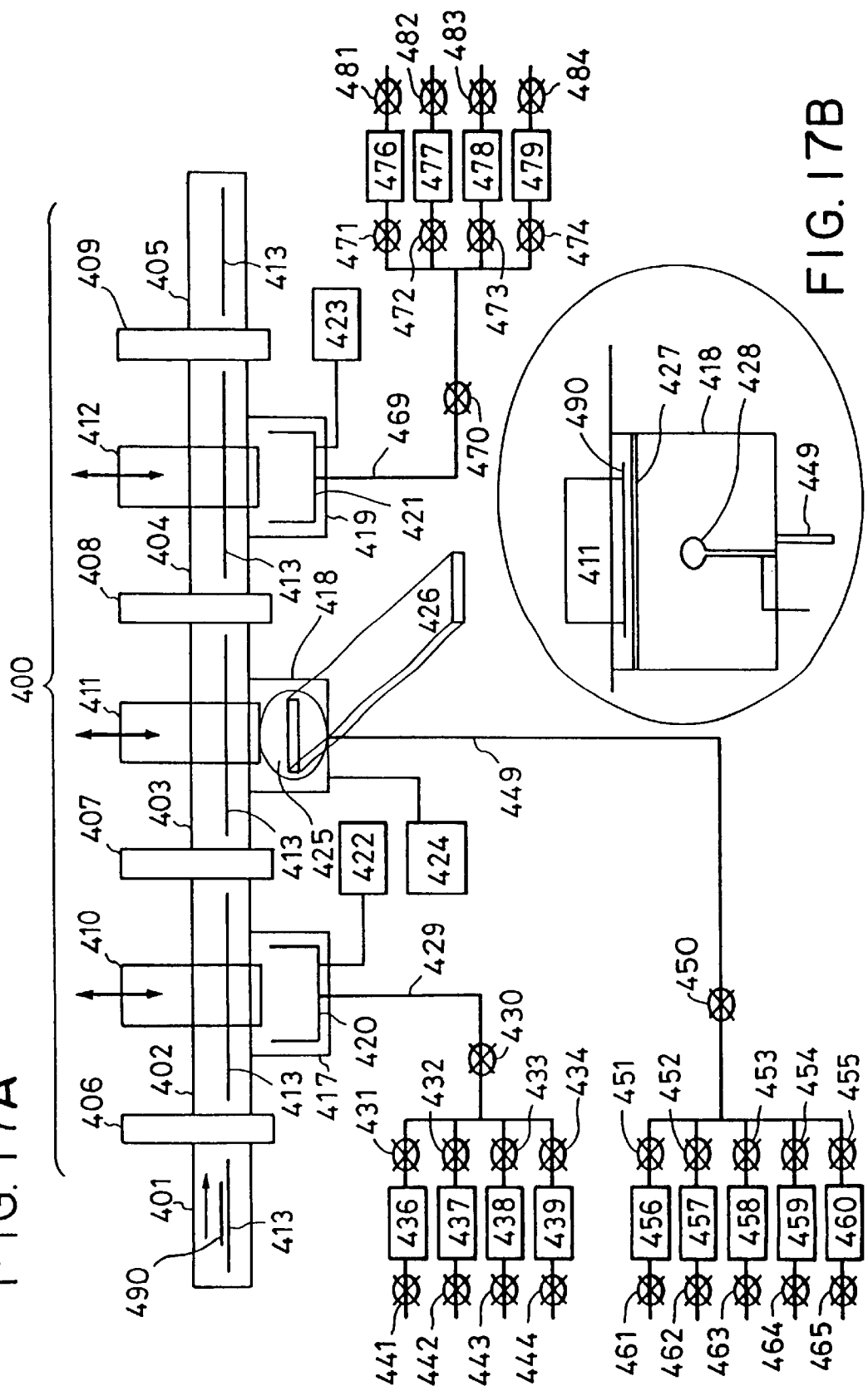
FIGS. 17A and 17B are a block diagram of a multi-chamber type magnetron sputtering system in accordance with the present invention.

A triple-type photovoltaic cell set forth in FIG. 15 was produced from the photovoltaic cell substrate SEx1 in a deposition system set forth in FIGS. 17A and 17B. This deposition system is applicable to both MWPCVD and RFPCVD. Three semiconductive layers were deposited on the transparent conductive layer 202 with this deposition system.

The deposition system is provided with material gas cylinders (not shown in the drawing) through gas inlet pipes. The material gas cylinders contain SiH$_4$ gas, CH$_4$ gas, GeH$_4$ gas, Si$_2$H$_6$ gas, a PH$_3$/H$_2$ (dilution: 0.1%) gas, a B$_2$H$_6$/H$_2$ (dilution: 0.2%) gas, H$_2$ gas, SiCl$_2$H$_2$ gas and a SiH$_4$/H$_2$ (dilution: 1%) gas, respectively. These gases were purified to high purity.

After the substrate 490 was loaded on substrate transferring rails 413 in a load-lock chamber 401, the load-lock chamber 401 was evacuated to approximately $1 \times 10^{-5}$ Torr with a vacuum evacuating pump (not shown in the drawing).

The substrate 490 was transferred to an n-type layer deposition chamber 417 through a transfer chamber 402 by opening a gate valve 406, wherein these chambers have been previously evacuated by vacuum evacuating pumps (not shown in the drawing). The back surface of the substrate 490 was brought into close contact with a substrate heater 410 and heated, and then the n-type layer deposition chamber 417 was evacuated to approximately $1 \times 10^{-5}$ Torr with a vacuum evacuating pump (not shown in the drawing).

After the preoperative step set forth above, H$_2$ gas was introduced into the n-type layer deposition chamber 417 through a gas inlet pipe 429 while controlling the flow rate to 300 sccm with valves 441, 431, 430 of a mass flow controller 436. Then, the pressure of the n-type layer deposition chamber 417 was adjusted to 1.1 Torr with a conductance valve (not shown in the drawing). The substrate 490 was heated to 350° C. with a substrate heater 410. After the substrate temperature became stable, an RFn-type layer 203 composed of $\mu$c-Si was deposited.

In order to deposit the RFn-type layer 203 composed of $\mu$c-Si, SiH$_4$ gas and PH$_3$/H$_2$ gas were introduced into the n-type layer deposition chamber 417 through the gas inlet pipe 429 by means of operation of valves 443, 433, 444 and 434. Flow rates of the SiH$_4$ gas, H$_2$ gas and PH$_3$/H$_2$ gas were regulated to 2 sccm, 120 sccm and 200 sccm, respectively, with their respective mass flow controllers 438, 436 and 439, while maintaining the pressure in the n-type layer deposition chamber 417 to 1.1 Torr. A high frequency (hereinafter RF) electric power of 0.05 W/cm$^3$ was applied to a plasma generating cap 420 through a RF power source 422 to generate glow discharge which deposited the RFn-type layer on the substrate. When the RFn-type layer reached 18 nm, the RF power source 422 was deenergized to cease glow discharge and film deposition. Supply of SiH$_4$ gas, PH$_3$/H$_2$ gas and H$_2$ gas into the n-type layer deposition chamber 417 was ceased; then the H$_2$ gas, SiH$_4$/H$_2$ gas, B$_2$H$_6$/H$_2$ gas and CH$_4$ gas were evacuated to $1 \times 10^{-5}$ Torr.

Next, an RFi-type layer composed of a-Si as an n/i buffer layer 251, an MWi-type layer 204 composed of a-SiGe, an RFi-type layer composed of a-Si as a p/i buffer layer 261, and an RFp-type layer 205 composed of a-SiC were separately deposited thereon.

The substrate 490 was transferred to an i-type layer deposition chamber 418 through a transfer chamber 403 by opening a gate valve 407, wherein these chambers have been previously evacuated by vacuum evacuating pumps (not shown in the drawing). The back surface of the substrate 490 was brought into close contact with a substrate heater 411 and heated, then the i-type layer deposition chamber 418 was evacuated to approximately $1 \times 10^{-5}$ Torr with a vacuum evacuating pump (not shown in the drawing).

For RFi-type layer deposition, the substrate 490 was heated to 280° C. with a substrate heater 411, then Si$_2$H$_6$ gas and H$_2$ gas were introduced into the i-type layer deposition chamber 418 through the gas inlet pipe 449 by gradually opening valves 464, 454, 450, 463 and 453. Flow rates of the Si$_2$H$_6$ gas and H$_2$ gas were regulated to 4 sccm and 110 sccm, respectively, with their respective mass flow controllers 459 and 458. The pressure in the i-type layer deposition chamber 418 was adjusted to 0.6 Torr with a conductance valve (not shown in the drawing). RF electric power of 0.008 W/cm$^3$ was applied to a bias rod 428 through a RF power source 424 to deposit an i-type layer on the RFn-type layer. When the i-type layer reached 10 nm, the RF power source 424 was deenergized to cease glow discharge and film deposition. Supply of Si$_2$H$_6$ gas and H$_2$ gas into the i-type layer deposition chamber 418 was ceased by closing valves 464, 454, 453 and 450; then the i-type layer deposition chamber 418 was evacuated to $1 \times 10^{-5}$ Torr.

For MWi-type layer deposition, the substrate 490 was heated to 380° C. with a substrate heater 411, then SiH$_4$ gas, GeH$_4$ gas and H$_2$ gas were introduced into the i-type layer deposition chamber 418 through the gas inlet pipe 449 by gradually opening valves 461, 451, 450, 462, 452, 463 and 453. Flow rates of the SiH$_4$ gas, GeH$_4$ gas and H$_2$ gas were regulated to 45 sccm, 39 sccm and 160 sccm, respectively, with their respective mass flow controllers 456, 457 and 458. The pressure in the i-type layer deposition chamber 418 was adjusted to 5 mTorr with a conductance valve (not shown in the drawing). RF electric power of 0.30 W/cm$^3$ was applied to a bias rod 428 through a RF power source 424, then μW electric power of 0.08 W/cm$^3$ from a μW electric power source (not shown in the drawing) was applied to the i-type layer deposition chamber 418 through a waveguide tube 426 and a microwave guiding window 425 to generate glow discharge. A shutter 427 was opened to deposit a MWi-type layer on the RFi-type layer. When the MWi-type layer reached 0.17 nm, the μW glow discharge was ceased and the RF power source 424 was deenergized to cease film deposition. Supply of SiH$_4$ gas, GeH$_4$ gas and H$_2$ gas into the i-type layer deposition chamber 418 was ceased by closing valves 451, 452 and 453; then the i-type layer deposition chamber 418 was evacuated to 1×10$^{-5}$ Torr.

For RFi-type layer deposition, the substrate 490 was heated to 250° C. with a substrate heater 411, then Si$_2$H$_6$ gas and H$_2$ gas were introduced into the i-type layer deposition chamber 418 through a gas inlet pipe 449 by gradually opening valves 464, 454, 450, 463 and 453. Flow rates of the Si$_2$H$_6$ gas and H$_2$ gas were regulated to 3 sccm and 90 sccm, respectively, with their respective mass flow controllers 459 and 458. The pressure in the i-type layer deposition chamber 418 was adjusted to 0.7 Torr with a conductance valve (not shown in the drawing). RF electric power of 0.007 W/cm$^3$ was applied to a bias rod 428 through a RF power source 424 to generate glow discharge. The shutter 427 was opened to deposit an RFi i-type layer on the MWi-type layer. When the i-type layer reached 20 nm, the RF power source 424 was deenergized to cease glow discharge and film deposition. Supply of Si$_2$H6 gas and H$_2$ gas into the i-type layer deposition chamber 418 was ceased by closing valves 464, 454, 453 and 450; then the i-type layer deposition chamber 418 was evacuated to 1×10$^{-5}$ Torr.

For depositing an RFp-type layer 105 composed of a-SiC, the substrate 490 was transferred to a p-type layer deposition chamber 419 through a transfer chamber 404 by opening a gate valve 408, wherein these chambers have been previously evacuated with a vacuum evacuating pump (not shown in the drawing). The back surface of the substrate 490 was brought into close contact with a substrate heater 412 and heated, then the p-type layer deposition chamber 419 was evacuated to approximately 1×10$^{-5}$ Torr with a vacuum evacuating pump (not shown in the drawing).

After the substrate 490 reached 230° C. due to heating with a substrate heater 412, H$_2$ gas, SiH$_4$/H$_2$ gas, B$_2$H$_6$/H$_2$ gas and CH$_4$ gas were introduced into the p-type layer deposition chamber 418 through a gas inlet pipe 469 by operating valves 481, 471, 470, 482, 472, 483, 473, 484 and 474. Flow rates of the H$_2$ gas, SiH$_4$/H$_2$ gas, B$_2$H$_6$/H$_2$ gas and CH$_4$ gas were regulated to 60 sccm, 2 sccm, 15 sccm and 0.3 sccm, respectively, with their respective mass flow controllers 476, 477, 478 and 479. The pressure in the p-type layer deposition chamber 419 was adjusted to 1.9 Torr with a conductance valve (not shown in the drawing). RF electric power of 0.07 W/cm$^3$ was applied to a plasma deposition cap 421 through a RF power source 423 to generate glow discharge and deposit an RFp-type layer on the i-type layer. When the RFp-type layer 105 reached 10 nm, the RF power source 423 was deenergized to cease glow discharge and film deposition. Supply of the H$_2$ gas, SiH$_4$/H$_2$ gas, B$_2$H$_6$/H$_2$ gas and CH$_4$ gas into the p-type layer deposition chamber 419 was ceased by closing valves 472, 482, 473, 483, 474, 484, 471 and 470; then the p-type layer deposition chamber 419 was evacuated to 1×10$^{-5}$ Torr.

After forming the bottom cell of the triple cell as set forth above, the substrate was transferred to the n-type layer deposition chamber 417 to form a middle cell 271 and a top cell 272 as in the bottom cell 270. The middle cell 271 has the same configuration as the bottom cell 270, that is, comprises an RFn-type layer 206, an n/i buffer layer 252, an MWi-type layer 207 composed of a-SiGe, a p/i buffer layer 262, and an RFp-type layer 208. The top cell 272 comprises an RFn-type layer 209, an MWi-type layer 210 and an RFp-type layer 211.

After depositing the p-type layer 211 in the top cell, the p-type layer deposition chamber 419 and gas inlet pipes were evacuated to 1×10$^{-5}$ Torr. The substrate 490 was transferred to an unload-lock chamber 405 previously evacuated with a vacuum evacuating pump (not shown in the drawing) by opening a gate valve 409; then the unload-lock chamber 405 was released by opening a leakage valve (not shown in the drawing).

On the RFp-type layer 211 of the top cell, a transparent electrode 212 of ITO having a thickness of 70 nm was deposited by a vacuum evaporation process. Then, a mask with a comb-type opening was placed on the transparent electrode 212, and a comb-type collective electrode 213 composed of Cr (40 nm)/Ag (1,000 nm) was deposited thereon by a vacuum evaporation process.

The photovoltaic cell produced as set forth above is referred to as SCEx1.

Comparative Example 1

A photovoltaic cell substrate (SCE1) and a photovoltaic cell (SCCE1) were prepared as in Example 1, but a Ni interlayer 299 was not formed and an Ag metal layer 201 having a thickness of 5 μm was formed by changing the target 331 to Ag.

(Evaluation)

(1) N, O and C Contents in the Interlayer

These contents were determined by secondary ion mass spectrometry (SIMS) using a part of the photovoltaic cell substrate.

(2) Bending Adhesion Test for NaCl Resistance

The photovoltaic cell substrate was dipped into sea water at 25° C. for 100 hours, and subjected to 30 bending cycles. A 10 kg weight was dropped 12 times from a height of 50 cm on the photovoltaic cell substrate after the bending cycles. Peeling of the substrate was observed with a scanning electron microscope (SEM) made by Hitachi Ltd.

(3) High Temperature Adhesion Test

The photovoltaic cell was placed into an environmental testing box and allowed to stand at 140° C. and 40% humidity for 5,000 hours. The photovoltaic cell was taken out from the box and subjected to 30 bending cycles. Then, a 10 kg weight was dropped 12 times from a height of 50 cm on the photovoltaic cell after the bending cycles. Peeling of the cell was observed with a scanning electron microscope (SEM) made by Hitachi Ltd.

(4) Reverse Bias Impression Test at High Temperature, High Humidity

The photovoltaic cell was placed into an environmental testing box. While controlling the box environment to 85° C. and 85% humidity, a reverse bias voltage of 0.85 V was applied to the photovoltaic cell. The dependence of RshDk on elapsed time was determined under these conditions.

(5) Bending Adhesion Test for Environmental Resistance

The photovoltaic cell was placed into an environmental testing box and allowed to stand at 85° C. and 85% humidity for 100 hours. The photovoltaic cell was taken out from the box and subjected to 30 bending cycles. Then, a 10 kg weight was dropped 12 times from a height of 50 cm on the photovoltaic cell after the bending cycles. Peeling of the cell was observed with a scanning electron microscope (SEM) made by Hitachi Ltd.

(6) Reflectance

The reflectance of the photovoltaic cell was determined by an integrating sphere-photometer.

Results of the bending adhesion test for NaCl resistance demonstrate that the photovoltaic cell substrate (SEx1) in accordance with the present invention does not peel, whereas the prior art photovoltaic cell substrate (SCEL) partly peels. Therefore, the photovoltaic cell substrate (SEx1) in accordance with the present invention exhibited satisfactory results in the bending adhesion test for NaCl resistance.

Results of the reverse bias impression test at high temperature and high humidity demonstrate that the minimum RshDk value of the photovoltaic cell (SCEx1) in accordance with the present invention is double of that of the prior art photovoltaic cell (SCCE1), and thus the photovoltaic cell (SCEx1) in accordance with the present invention has satisfactory results in the reverse bias impression test at high temperature and humidity.

Results of the bending adhesion test for environmental resistance demonstrate that the photovoltaic cell (SCEx1) in accordance with the present invention does not peel at all, whereas the prior art photovoltaic cell (SCCE1) partly peels. Therefore, the photovoltaic cell (SCEx1) in accordance with the present invention exhibits satisfactory results in the bending adhesion test for environmental resistance.

These photovoltaic cells (SCEx1) and (SCCE1) were irradiated with light of AM1.5 (100 mW/cm$^2$) before and after the bending adhesion test for environmental resistance to determine changes in I–V characteristics during the bending adhesion test for environmental resistance. Results are set forth in Table 1.

TABLE 1

|  | SCEx1 | SCCE1 |
| --- | --- | --- |
| Conversion efficiency (after test/before test) | 1.00 | 0.85 |
| Curvilinear factor (after test/before test) | 1.00 | 0.90 |
| Series resistance (after test/before test) | 1.00 | 1.30 |

The results set forth in Table 1 demonstrate that the conversion efficiency, curvilinear factor and series resistance of the prior art photovoltaic cell (SCCE1) deteriorate during the bending adhesion test for environmental resistance, whereas those of the photovoltaic cell (SCEx1) in accordance with the present invention do not change. These results also illustrate that the photovoltaic cell (SCEx1) in accordance with the present invention has excellent durability to this test.

Accordingly, the photovoltaic cell (SCEx1) in accordance with the present invention has excellent long term durability to high temperature, high humidity environments and chloride ion environments.

Example 2

A photovoltaic cell substrate (SEx2) was prepared as in Example 1, except that the interlayer 299 is composed of Cr and has a thickness of 0.1 μm, the metal layer 201 on the Cr interlayer 299 is composed of AlMg (Mg: 20 percent by weight) and has a thickness of 1.0 μm the transparent conductive layer 202 is composed of ZnO, and the Cr interlayer 299 was formed by introducing Ar gas at 100 sccm and O$_2$/Ar gas at 1 sccm through the gas inlet pipe 324 and adjusting the pressure to 8 mTorr with the conductance valve (not shown in the drawing). The Cr interlayer 299 contained 80 ppm of O.

A photovoltaic cell (SCEx2) was prepared using the photovoltaic cell substrate (SEx2) under the same conditions as in Example 1.

Comparative Example 2

A photovoltaic cell substrate (SCE2) and a photovoltaic cell (SCCE2) were prepared as in Example 2, except that the Cr interlayer 299 was not formed, and an Ag metal layer 201 having a thickness of 1.0 μm was formed by changing the target 331 to Ag.

Results of the bending adhesion test for NaCl resistance demonstrate that the photovoltaic cell substrate (SEx2) in accordance with the present invention does not peel, whereas the prior art photovoltaic cell substrate (SCE2) partly peels. Therefore, the photovoltaic cell substrate (SEx2) in accordance with the present invention exhibits satisfactory results in the bending adhesion test for NaCl resistance.

Results of the reverse bias impression test at high temperature and high humidity demonstrate that the minimum RshDk value of the photovoltaic cell (SCEx2) in accordance with the present invention is 1.8 times that of the prior art photovoltaic cell (SCCE2), and thus the photovoltaic cell (SCEx2) in accordance with the present invention has satisfactory results in the reverse bias impression test at high temperature and high humidity.

Results of the bending adhesion test for environmental resistance demonstrate that the photovoltaic cell (SCEx2) in accordance with the present invention does not peel at all, whereas the prior art photovoltaic cell (SCCE2) partly peels. Therefore, the photovoltaic cell (SCEx2) in accordance with the present invention exhibits satisfactory results in the bending adhesion test for environmental resistance.

These photovoltaic cells (SCEx2) and (SCCE2) were irradiated with light of AM1.5 (100 mW/cm$^2$) before and after the bending adhesion test for environmental resistance to determine changes in I–V characteristics during the bending adhesion test for environmental resistance. Results are set forth in Table 2.

TABLE 2

|  | SCEx2 | SCCE2 |
| --- | --- | --- |
| Conversion efficiency (after test/before test) | 1.00 | 0.80 |
| Curvilinear factor (after test/before test) | 1.00 | 0.85 |
| Series resistance (after test/before test) | 1.00 | 1.40 |

The results set forth in Table 2 demonstrate that the conversion efficiency, curvilinear factor and series resistance of the prior art photovoltaic cell (SCCE2) deteriorate during the bending adhesion test for environmental resistance, whereas those of the photovoltaic cell (SCEx2) in accordance with the present invention do not change. These results also illustrate that the photovoltaic cell (SCEx2) in accordance with the present invention has excellent durability to this test.

Accordingly, the photovoltaic cell (SCEx2) in accordance with the present invention has excellent long term durability to high temperature, high humidity environments and chloride ion environments.

Example 3

A photovoltaic cell substrate (SEx3) was prepared as in Example 1, except that the interlayer 299 is composed of Ti and has a thickness of 1.5 μm, the metal layer 201 on the Ti interlayer 299 is composed of AlMg (Mg: 30 percent by weight) and has a thickness of 0.7 μm, the transparent conductive layer 202 is composed of ZnO, and the Ti interlayer 299 was formed by introducing Ar gas at 100 sccm and $CH_4$/Ar gas at 6 sccm through the gas inlet pipe 324 and adjusting the pressure to 4 mTorr with the conductance valve (not shown in the drawing). The Ti interlayer 299 contained 1,000 ppm of C.

A photovoltaic cell (SCEx3) was prepared using the photovoltaic cell substrate (SEx3) under the same conditions as in Example 1.

Comparative Example 3

A photovoltaic cell substrate (SCE3) and a photovoltaic cell (SCCE3) were prepared as in Example 3, except that the Ti interlayer 299 was not formed, and an Ag metal layer 201 having a thickness of 0.7 μm was formed by changing the target 331 to Ag.

Results of the bending adhesion test for NaCl resistance demonstrate that the photovoltaic cell substrate (SEx3) in accordance with the present invention does not peel, whereas the prior art photovoltaic cell substrate (SCE3) partly peels. Therefore, the photovoltaic cell substrate (SEx3) in accordance with the present invention exhibits satisfactory results in the bending adhesion test for NaCl resistance.

Results of the reverse bias impression test at high temperature and high humidity demonstrate that the minimum RshDk value of the photovoltaic cell (SCEx3) in accordance with the present invention is 1.9 times that of the prior art photovoltaic cell (SCCE3), and thus the photovoltaic cell (SCEx3) in accordance with the present invention has satisfactory results in the reverse bias impression test at high temperature and high humidity.

Results of the bending adhesion test for environmental resistance demonstrate that the photovoltaic cell (SCEx3) in accordance with the present invention does not peel at all, whereas the prior art photovoltaic cell (SCCE3) partly peels. Therefore, the photovoltaic cell (SCEx3) in accordance with the present invention exhibits satisfactory results in the bending adhesion test for environmental resistance.

These photovoltaic cells (SCEx3) and (SCCE3) were irradiated with light of AM1.5 (100 mW/cm$^2$) before and after the bending adhesion test for environmental resistance to determine changes in I–V characteristics during the bending adhesion test for environmental resistance. Results are set forth in Table 3.

TABLE 3

|  | SCEx3 | SCCE3 |
| --- | --- | --- |
| Conversion efficiency (after test/before test) | 1.00 | 0.87 |
| Curvilinear factor (after test/before test) | 1.00 | 0.88 |
| Series resistance (after test/before test) | 1.00 | 1.30 |

The results set forth in Table 3 demonstrate that the conversion efficiency, curvilinear factor and series resistance of the prior art photovoltaic cell (SCCE3) deteriorate during the bending adhesion test for environmental resistance, whereas those of the photovoltaic cell (SCEx3) in accordance with the present invention do not change. These results also illustrate that the photovoltaic cell (SCEx3) in accordance with the present invention has excellent durability to this test.

Accordingly, the photovoltaic cell (SCEx3) in accordance with the present invention has excellent long term durability to high temperature, high humidity environments and chloride ion environments.

Example 4

A photovoltaic cell substrate (SEx4) was prepared as in Example 1, except that the interlayer 299 is composed of a Ni—Cr alloy (Cr: 10 percent by weight) and has a thickness of 0.3 μm, the metal layer 201 on the Ni—Cr interlayer 299 is composed of AlMg (Mg: 15 percent by weight) and has a thickness of 0.3 μm, the transparent conductive layer 202 is composed of ZnO, and the Ni—Cr interlayer 299 was formed by introducing Ar gas at 100 sccm, $N_2$/Ar gas at 1 sccm and $O_2$/Ar gas at 1 sccm through the gas inlet pipe 324 and adjusting the pressure to 8 mTorr with the conductance valve (not shown in the drawing). The Ni—Cr interlayer 299 contained 80 ppm of N and 80 ppm of O.

A photovoltaic cell (SCEx4) was prepared using the photovoltaic cell substrate (SEx4) under the same conditions as in Example 1.

(Comparative Example 4)

A photovoltaic cell substrate (SCE4) and a photovoltaic cell (SCCE4) were prepared as in Example 4, except that the Ni—Cr (90:10) interlayer 299 was not formed, and an Ag metal layer 201 having a thickness of 0.3 μm was formed by changing the target 331 to Ag.

Results of the bending adhesion test for NaCl resistance demonstrate that the photovoltaic cell substrate (SEx4) in accordance with the present invention does not peel, whereas the prior art photovoltaic cell substrate (SCE4) partly peels. Therefore, the photovoltaic cell substrate (SEx4) in accordance with the present invention exhibits satisfactory results in the bending adhesion test for NaCl resistance.

Results of the reverse bias impression test at high temperature and high humidity demonstrate that the minimum RshDk value of the photovoltaic cell (SCEx4) in accordance with the present invention is 1.8 times that of the prior art photovoltaic cell (SCCE4), and thus the photovoltaic cell (SCEx4) in accordance with the present invention has satisfactory results in the reverse bias impression test at high temperature and high humidity.

Results of the bending adhesion test for environmental resistance demonstrate that the photovoltaic cell (SCEx4) in accordance with the present invention does not peel at all, whereas the prior art photovoltaic cell (SCCE4) partly peels. Therefore, the photovoltaic cell (SCEx4) in accordance with the present invention exhibits satisfactory results in the bending adhesion test for environmental resistance.

These photovoltaic cells (SCEx4) and (SCCE4) were irradiated with light of AM1.5 (100 mW/cm$^2$) before and after the bending adhesion test for environmental resistance to determine changes in I–V characteristics during the bending adhesion test for environmental resistance. Results are set forth in Table 4.

TABLE 4

|  | SCEx4 | SCCE4 |
|---|---|---|
| Conversion efficiency (after test/before test) | 1.00 | 0.90 |
| Curvilinear factor (after test/before test) | 1.00 | 0.92 |
| Series resistance (after test/before test) | 1.00 | 1.20 |

The results set forth in Table 4 demonstrate that the conversion efficiency, curvilinear factor and series resistance of the prior art photovoltaic cell (SCCE4) deteriorate during the bending adhesion test for environmental resistance, whereas those of the photovoltaic cell (SCEx4) in accordance with the present invention do not change. These results also illustrate that the photovoltaic cell (SCEx4) in accordance with the present invention has excellent durability to this test.

Accordingly, the photovoltaic cell (SCEx4) in accordance with the present invention has excellent long term durability to high temperature, high humidity environments and chloride ion environments.

Example 5

Photovoltaic cell substrates (SEx5-1 to SEx5-8) provided with Ni interlayers 299 having different N contents were prepared as in Example 1, except that the N$_2$ gas content to the Ar gas content was changed to a range from 10 ppm to 20,000 ppm by controlling the ratio of the N$_2$ gas flow rate and the Ar gas flow rate in the Ni interlayer deposition process. The thickness of each Ni interlayer 229 was 0.05 μm. The N contents in the Ni interlayers 299 ranged from 1 ppm to 15,000 ppm. Photovoltaic cells (SCEx5-1 to SEx5-8) were prepared using the photovoltaic cell substrates (SEx5-1 to SEx5-8) under the same conditions as in Example 1.

The results of reflectance of these cells which is normalized with SEx5-1 are set forth in Table 5.

TABLE 5

|  | N content (ppm) | Reflectance |
|---|---|---|
| SEx5-1 | 1 | 1 |
| SEx5-2 | 5 | 1.1 |
| SEx5-3 | 10 | 1.2 |
| SEx5-4 | 100 | 1.2 |
| SEx5-5 | 1,000 | 1.2 |
| SEx5-6 | 5,000 | 1.1 |
| SEx5-7 | 10,000 | 1.1 |
| SEx5-8 | 15,000 | 0.6 |

The results of the bending adhesion test for environmental resistance are set forth in Table 6.

TABLE 6

|  | N content (ppm) | Peeling |
|---|---|---|
| SEx5-1 | 1 | Slightly observed |
| SEx5-2 | 5 | Slightly observed |
| SEx5-3 | 10 | Not observed |
| SEx5-4 | 100 | Not observed |
| SEx5-5 | 1,000 | Not observed |
| SEx5-6 | 5,000 | Not observed |
| SEx5-7 | 10,000 | Not observed |
| SEx5-8 | 15,000 | Slightly observed |

Example 6

Photovoltaic cell substrates (SEx6-1 to SEx6-8) provided with Ni interlayers 299 having different O contents were prepared as in Example 1, except that the O$_2$ gas content to the Ar gas content was changed to a range from 10 ppm to 20,000 ppm by controlling the ratio of the O$_2$ gas flow rate and the Ar gas flow rate in the Ni interlayer deposition process. The thickness of each Ni interlayer 229 was 0.05 μm. The O contents in the Ni interlayers 299 ranged from 1 ppm to 15,000 ppm. Photovoltaic cells (SCEx6-1 to SCEx6-8) were prepared using the photovoltaic cell substrates (SEx6-1 to SEx6-8) under the same conditions as in Example 1.

The results of reflectance of these cells which is normalized with SEx6-1 are set forth in Table 7.

TABLE 7

|  | O content (ppm) | Reflectance |
|---|---|---|
| SEx6-1 | 1 | 1 |
| SEx6-2 | 5 | 1.0 |
| SEx6-3 | 10 | 1.1 |
| SEx6-4 | 100 | 1.1 |
| SEx6-5 | 1,000 | 1.2 |
| SEx6-6 | 5,000 | 1.1 |
| SEx6-7 | 10,000 | 1.1 |
| SEx6-8 | 15,000 | 0.7 |

The results of the bending adhesion test for environmental resistance are set forth in Table 8.

TABLE 8

|  | O content (ppm) | Peeling |
|---|---|---|
| SEx6-1 | 1 | Slightly observed |
| SEx6-2 | 5 | Slightly observed |
| SEx6-3 | 10 | Not observed |
| SEx6-4 | 100 | Not observed |
| SEx6-5 | 1,000 | Not observed |
| SEx6-6 | 5,000 | Not observed |
| SEx6-7 | 10,000 | Not observed |
| SEx6-8 | 15,000 | Slightly observed |

Example 7

Photovoltaic cell substrates (SEx7-1 to SEx7-8) provided with Ni interlayers 299 having different C contents were prepared as in Example 1, except that the CH$_4$ gas content to the Ar gas content was changed to a range from 10 ppm to 20,000 ppm by controlling the ratio of the CH$_4$ gas flow rate and the Ar gas flow rate in the Ni interlayer deposition process. The thickness of each Ni interlayer 229 was 0.05 μm. The C contents in the Ni interlayers 299 ranged from 1 ppm to 15,000 ppm. Photovoltaic cells (SCEx7-1 to SCEx7-8) were prepared using the photovoltaic cell substrates (SEx7-1 to SEx7-8) under the same conditions as in Example 1.

The results of reflectance of these cells which is normalized with SEx7-1 are set forth in Table 9.

TABLE 9

| | C content (ppm) | Reflectance |
| --- | --- | --- |
| SEx7-1 | 1 | 1 |
| SEx7-2 | 5 | 1.1 |
| SEx7-3 | 10 | 1.1 |
| SEx7-4 | 100 | 1.1 |
| SEx7-5 | 1,000 | 1.1 |
| SEx7-6 | 5,000 | 1.0 |
| SEx7-7 | 10,000 | 1.0 |
| SEx7-8 | 15,000 | 0.8 |

The results of the bending adhesion test for environmental resistance are set forth in Table 10.

TABLE 10

| | C content (ppm) | Peeling |
| --- | --- | --- |
| SEx7-1 | 1 | Slightly observed |
| SEx7-2 | 5 | Slightly observed |
| SEx7-3 | 10 | Not observed |
| SEx7-4 | 100 | Not observed |
| SEx7-5 | 1,000 | Not observed |
| SEx7-6 | 5,000 | Not observed |
| SEx7-7 | 10,000 | Not observed |
| SEx7-8 | 15,000 | Slightly observed |

Example 8

Photovoltaic cell substrates (SEx8-1 to SEx8-8) provided with Cr interlayers 299 having different N contents were prepared as in Example 2, except that the $N_2$ gas content to the Ar gas content was changed to a range from 10 ppm to 20,000 ppm by controlling the ratio of the $N_2$ gas flow rate and the Ar gas flow rate in the Cr interlayer deposition process. The thickness of each Cr interlayer 229 was 0.1 μm. The N contents in the Cr interlayers 299 ranged from 1 ppm to 15,000 ppm. Photovoltaic cells (SCEx8-1 to SCEx8-8) were prepared using the photovoltaic cell substrates (SEx8-1 to SEx8-8) under the same conditions as in Example 2.

The results of reflectance of these cells which is normalized with SEx8-1 are set forth in Table 11.

TABLE 11

| | N content (ppm) | Reflectance |
| --- | --- | --- |
| SEx8-1 | 1 | 1 |
| SEx8-2 | 5 | 1.1 |
| SEx8-3 | 10 | 1.1 |
| SEx8-4 | 100 | 1.0 |
| SEx8-5 | 1,000 | 1.0 |
| SEx8-6 | 5,000 | 1.0 |
| SEx8-7 | 10,000 | 1.0 |
| SEx8-8 | 15,000 | 0.7 |

The results of the bending adhesion test for environmental resistance are set forth in Table 12.

TABLE 12

| | N content (ppm) | Peeling |
| --- | --- | --- |
| SEx8-1 | 1 | Slightly observed |
| SEx8-2 | 5 | Slightly observed |
| SEx8-3 | 10 | Not observed |

TABLE 12-continued

| | N content (ppm) | Peeling |
| --- | --- | --- |
| SEx8-4 | 100 | Not observed |
| SEx8-5 | 1,000 | Not observed |
| SEx8-6 | 5,000 | Not observed |
| SEx8-7 | 10,000 | Not observed |
| SEx8-8 | 15,000 | Slightly observed |

Example 9

Photovoltaic cell substrates (SEx9-1 to SEx9-8) provided with Cr interlayers 299 having different O contents were prepared as in Example 2, except that the $O_2$ gas content to the Ar gas content was changed to a range from 10 ppm to 20,000 ppm by controlling the ratio of the $O_2$ gas flow rate and the Ar gas flow rate in the Cr interlayer deposition process. The thickness of each Cr interlayer 229 was 0.1 μm. The O contents in the Cr interlayers 299 ranged from 1 ppm to 15,000 ppm. Photovoltaic cells (SCEx9-1 to SCEx9-8) were prepared using the photovoltaic cell substrates (SEx9-1 to SEx9-8) under the same conditions as in Example 2.

The results of reflectance of these cells which is normalized with SEx9-1 are set forth in Table 13.

TABLE 13

| | O content (ppm) | Reflectance |
| --- | --- | --- |
| SEx9-1 | 1 | 1 |
| SEx9-2 | 5 | 1.0 |
| SEx9-3 | 10 | 1.1 |
| SEx9-4 | 100 | 1.1 |
| SEx9-5 | 1,000 | 1.2 |
| SEx9-6 | 5,000 | 1.1 |
| SEx9-7 | 10,000 | 1.0 |
| SEx9-8 | 15,000 | 0.7 |

The results of the bending adhesion test for environmental resistance are set forth in Table 14.

TABLE 14

| | O content (ppm) | Peeling |
| --- | --- | --- |
| SEx9-1 | 1 | Slightly observed |
| SEx9-2 | 5 | Slightly observed |
| SEx9-3 | 10 | Not observed |
| SEx9-4 | 100 | Not observed |
| SEx9-5 | 1,000 | Not observed |
| SEx9-6 | 5,000 | Not observed |
| SEx9-7 | 10,000 | Not observed |
| SEx9-8 | 15,000 | Slightly observed |

Example 10

Photovoltaic cell substrates (SEx10-1 to SEx10-8) provided with Cr interlayers 299 having different C contents were prepared as in Example 2, except that the $CH_4$ gas content to the Ar gas content was changed to a range from 10 ppm to 20,000 ppm by controlling the ratio of the $CH_4$ gas flow rate and the Ar gas flow rate in the Cr interlayer deposition process. The thickness of each Cr interlayer 229 was 0.1 μm. The C contents in the Cr interlayers 299 ranged from 1 ppm to 15,000 ppm. Photovoltaic cells (SCEx10-1 to SCEx10-8) were prepared using the photovoltaic cell substrates (SEx10-1 to SEx10-8) under the same conditions as in Example 2.

The results of reflectance of these cells which is normalized with SEx10-1 are set forth in Table 15.

TABLE 15

|        | C content (ppm) | Reflectance |
|--------|-----------------|-------------|
| SEx10-1 | 1      | 1   |
| SEx10-2 | 5      | 1.0 |
| SEx10-3 | 10     | 1.1 |
| SEx10-4 | 100    | 1.1 |
| SEx10-5 | 1,000  | 1.1 |
| SEx10-6 | 5,000  | 1.1 |
| SEx10-7 | 10,000 | 1.0 |
| SEx10-8 | 15,000 | 0.7 |

The results of the bending adhesion test for environmental resistance are set forth in Table 16.

TABLE 16

|        | C content (ppm) | Peeling |
|--------|-----------------|---------|
| SEx10-1 | 1      | Slightly observed |
| SEx10-2 | 5      | Slightly observed |
| SEx10-3 | 10     | Not observed |
| SEx10-4 | 100    | Not observed |
| SEx10-5 | 1,000  | Not observed |
| SEx10-6 | 5,000  | Not observed |
| SEx10-7 | 10,000 | Not observed |
| SEx10-8 | 15,000 | Slightly observed |

Example 11

Photovoltaic cell substrates (SEx11-1 to SEx11-8) provided with Ti interlayers 299 having different N contents were prepared as in Example 3, except that the $N_2$ gas content to the Ar gas content was changed to a range from 10 ppm to 20,000 ppm by controlling the ratio of the $N_2$ gas flow rate and the Ar gas flow rate in the Ti interlayer deposition process. The thickness of each Ti interlayer 229 was 1.5 μm. The N contents in the Ti interlayers 299 ranged from 1 ppm to 15,000 ppm. Photovoltaic cells (SCEx11-1 to SCEx11-8) were prepared using the photovoltaic cell substrates (SEx11-1 to SEx11-8) under the same conditions as in Example 3.

The results of reflectance of these cells which is normalized with SEx11-1 are set forth in Table 17.

TABLE 17

|        | N content (ppm) | Reflectance |
|--------|-----------------|-------------|
| SEx11-1 | 1      | 1   |
| SEx11-2 | 5      | 1.1 |
| SEx11-3 | 10     | 1.1 |
| SEx11-4 | 100    | 1.2 |
| SEx11-5 | 1,000  | 1.2 |
| SEx11-6 | 5,000  | 1.0 |
| SEx11-7 | 10,000 | 1.0 |
| SEx11-8 | 15,000 | 0.6 |

The results of the bending adhesion test for environmental resistance are set forth in Table 18.

TABLE 18

|        | N content (ppm) | Peeling |
|--------|-----------------|---------|
| SEx11-1 | 1      | Slightly observed |
| SEx11-2 | 5      | Slightly observed |
| SEx11-3 | 10     | Not observed |
| SEx11-4 | 100    | Not observed |
| SEx11-5 | 1,000  | Not observed |
| SEx11-6 | 5,000  | Not observed |
| SEx11-7 | 10,000 | Not observed |
| SEx11-8 | 15,000 | Slightly observed |

Example 12

Photovoltaic cell substrates (SEx12-1 to SEx12-8) provided with Ti interlayers 299 having different O contents were prepared as in Example 3, except that the $O_2$ gas content to the Ar gas content was changed to a range from 10 ppm to 20,000 ppm by controlling the ratio of the $O_2$ gas flow rate and the Ar gas flow rate in the Ti interlayer deposition process. The thickness of each Ti interlayer 229 was 1.5 μm. The O contents in the Ti interlayers 299 ranged from 1 ppm to 15,000 ppm. Photovoltaic cells (SCEx12-1 to SCEx12-8) were prepared using the photovoltaic cell substrates (SEx12-1 to SEx12-8) under the same conditions as in Example 3.

The results of reflectance of these cells which is normalized with SEx12-1 are set forth in Table 19.

TABLE 19

|        | O content (ppm) | Reflectance |
|--------|-----------------|-------------|
| SEx12-1 | 1      | 1   |
| SEx12-2 | 5      | 1.0 |
| SEx12-3 | 10     | 1.1 |
| SEx12-4 | 100    | 1.2 |
| SEx12-5 | 1,000  | 1.1 |
| SEx12-6 | 5,000  | 1.0 |
| SEx12-7 | 10,000 | 1.0 |
| SEx12-8 | 15,000 | 0.8 |

The results of the bending adhesion test for environmental resistance are set forth in Table 20.

TABLE 20

|        | O content (ppm) | Peeling |
|--------|-----------------|---------|
| SEx12-1 | 1      | Slightly observed |
| SEx12-2 | 5      | Slightly observed |
| SEx12-3 | 10     | Not observed |
| SEx12-4 | 100    | Not observed |
| SEx12-5 | 1,000  | Not observed |
| SEx12-6 | 5,000  | Not observed |
| SEx12-7 | 10,000 | Not observed |
| SEx12-8 | 15,000 | Slightly observed |

Example 13

Photovoltaic cell substrates (SEx13-1 to SEx13-8) provided with Ti interlayers 299 having different C contents were prepared as in Example 3, except that the $CH_4$ gas content to the Ar gas content was changed to a range from 10 ppm to 20,000 ppm by controlling the ratio of the $CH_4$ gas flow rate and the Ar gas flow rate in the Ti interlayer deposition process. The thickness of each Ti interlayer 229 was 1.5 μm. The C contents in the Ti interlayers 299 ranged from 1 ppm to 15,000 ppm. Photovoltaic cells (SCEx13-1 to SCEx13-8) were prepared using the photovoltaic cell substrates (SEx13-1 to SEx13-8) under the same conditions as in Example 3.

The results of reflectance of these cells which is normalized with SEx13-1 are set forth in Table 21.

TABLE 21

| | C content (ppm) | Reflectance |
|---|---|---|
| SEx13-1 | 1 | 1 |
| SEx13-2 | 5 | 1.0 |
| SEx13-3 | 10 | 1.0 |
| SEx13-4 | 100 | 1.0 |
| SEx13-5 | 1,000 | 1.1 |
| SEx13-6 | 5,000 | 1.0 |
| SEx13-7 | 10,000 | 1.0 |
| SEx13-8 | 15,000 | 0.7 |

The results of the bending adhesion test for environmental resistance are set forth in Table 22.

TABLE 22

| | C content (ppm) | Peeling |
|---|---|---|
| SEx13-1 | 1 | Slightly observed |
| SEx13-2 | 5 | Slightly observed |
| SEx13-3 | 10 | Not observed |
| SEx13-4 | 100 | Not observed |
| SEx13-5 | 1,000 | Not observed |
| SEx13-6 | 5,000 | Not observed |
| SEx13-7 | 10,000 | Not observed |
| SEx13-8 | 15,000 | Slightly observed |

Example 14

Photovoltaic cell substrates (SEx14-1 to SEx14-8) provided with Ni interlayers 299 which have different total contents of N, O and C atoms were prepared as in Example 1, except that the total gas content of $N_2$, $O_2$ and $CH_4$ gas to the Ar gas content was changed to a range from 10 ppm to 20,000 ppm by controlling these gas flow rates in the Ni interlayer deposition process. The thickness of each Ni interlayer 229 was 0.05 μm. The total contents of N, O and C atoms in the Ni interlayers 299 ranged from 1 ppm to 15,000 ppm. Photovoltaic cells (SCEx14-1 to SCEx14-8) were prepared using the photovoltaic cell substrates (SEx14-1 to SEx14-8) under the same conditions as in Example 1.

The results of reflectance of these cells which is normalized with SEx14-1 are set forth in Table 23.

TABLE 23

| | Total content (ppm) | Reflectance |
|---|---|---|
| SEx14-1 | 1 | 1 |
| SEx14-2 | 5 | 1.1 |
| SEx14-3 | 10 | 1.1 |
| SEx14-4 | 100 | 1.1 |
| SEx14-5 | 1,000 | 1.1 |
| SEx14-6 | 5,000 | 1.0 |
| SEx14-7 | 10,000 | 1.0 |
| SEx14-8 | 15,000 | 0.8 |

The results of the bending adhesion test for environmental resistance are set forth in Table 24.

TABLE 24

| | Total content (ppm) | Peeling |
|---|---|---|
| SEx14-1 | 1 | Slightly observed |
| SEx14-2 | 5 | Slightly observed |
| SEx14-3 | 10 | Not observed |
| SEx14-4 | 100 | Not observed |
| SEx14-5 | 1,000 | Not observed |
| SEx14-6 | 5,000 | Not observed |
| SEx14-7 | 10,000 | Not observed |
| SEx14-8 | 15,000 | Slightly observed |

Example 15

Photovoltaic cell substrates (SEx15-1 to SEx15-8) provided with Ni interlayers 299 which have different thicknesses ranging from 0.01 μm to 3 μm were prepared as in Example 1. The N content in each Ni interlayers 299 was 500 ppm. Photovoltaic cells (SCEx15-1 to SCEx15-8) were prepared using the photovoltaic cell substrates (SEx15-1 to SEx15-8) under the same conditions as in Example 1.

The results of the bending adhesion test for environmental resistance are set forth in Table 25.

TABLE 25

| | Film thickness (μm) | Peeling |
|---|---|---|
| SEx15-1 | 0.01 | Slightly observed |
| SEx15-2 | 0.02 | Slightly observed |
| SEx15-3 | 0.03 | Not observed |
| SEx15-4 | 0.05 | Not observed |
| SEx15-5 | 0.1 | Not observed |
| SEx15-6 | 1.0 | Not observed |
| SEx15-7 | 2.0 | Not observed |
| SEx15-8 | 3.0 | Slightly observed |

Example 16

Photovoltaic cell substrates (SEx16-1 to SEx16-8) provided with Cr interlayers 299 which have different thicknesses ranging from 0.01 μm to 3 μm were prepared as in Example 2. The O content in each Cr interlayer 299 was 80 ppm. Photovoltaic cells (SCEx16-1 to SCEx16-8) were prepared using the photovoltaic cell substrates (SEx16-1 to SEx16-8) under the same conditions as in Example 2.

The results of the bending adhesion test for environmental resistance are set forth in Table 26.

TABLE 26

| | Film thickness (μm) | Peeling |
|---|---|---|
| SEx16-1 | 0.01 | Slightly observed |
| SEx16-2 | 0.02 | Slightly observed |
| SEx16-3 | 0.03 | Not observed |
| SEx16-4 | 0.05 | Not observed |
| SEx16-5 | 0.1 | Not observed |
| SEx16-6 | 1.0 | Not observed |
| SEx16-7 | 2.0 | Not observed |
| SEx16-8 | 3.0 | Slightly observed |

Example 17

Photovoltaic cell substrates (SEx17-1 to SEx17-8) provided with Ti interlayers 299 which have different thicknesses ranging from 0.01 μm to 3 μm were prepared as in Example 3. The C content in each Ti interlayer 299 was 1,000 ppm. Photovoltaic cells (SCEx17-1 to SCEx17-8) were prepared using the photovoltaic cell substrates (SEx17-1 to SEx17-8) under the same conditions as in Example 3.

The results of the bending adhesion test for environmental resistance are set forth in Table 27.

TABLE 27

| | Film thickness (μm) | Peeling |
| --- | --- | --- |
| SEx17-1 | 0.01 | Slightly observed |
| SEx17-2 | 0.02 | Slightly observed |
| SEx17-3 | 0.03 | Not observed |
| SEx17-4 | 0.05 | Not observed |
| SEx17-5 | 0.1 | Not observed |
| SEx17-6 | 1.0 | Not observed |
| SEx17-7 | 2.0 | Not observed |
| SEx17-8 | 3.0 | Slightly observed |

Example 18

Photovoltaic cell substrates (SEx18-1 to SEx18-8) provided with Al—Mg metal layer 201 which have different Mg contents ranging from 0.1 percent by weight to 50 percent by weight were prepared as in Example 1. Photovoltaic cells (SCEx18-1 to SCEx18-8) were prepared using the photovoltaic cell substrates (SEx18-1 to SEx18-8) under the same conditions as in Example 1.

The results of the bending adhesion test for NaCl resistance are set forth in Table 28.

TABLE 28

| | Mg content (wt %) | Peeling |
| --- | --- | --- |
| SEx18-1 | 0.1 | Observed |
| SEx18-2 | 0.2 | Slightly observed |
| SEx18-3 | 0.5 | Not observed |
| SEx18-4 | 1 | Not observed |
| SEx18-5 | 10 | Not observed |
| SEx18-6 | 30 | Not observed |
| SEx18-7 | 40 | Not observed |
| SEx18-8 | 50 | Not observed |

The results of the bending adhesion test for environmental resistance are set forth in Table 29.

TABLE 29

| | Mg content (wt %) | Peeling |
| --- | --- | --- |
| SEx18-1 | 0.1 | Not observed |
| SEx18-2 | 0.2 | Not observed |
| SEx18-3 | 0.5 | Not observed |
| SEx18-4 | 1 | Not observed |
| SEx18-5 | 10 | Not observed |
| SEx18-6 | 30 | Not observed |
| SEx18-7 | 40 | Not observed |
| SEx18-8 | 50 | Slightly observed |

Example 19

Photovoltaic cell substrates (SEx19-1 to SEx19-8) provided with Al—Mg metal layer 201 which have different thicknesses ranging from 0.01 μm to 2μm were prepared as in Example 1. Photovoltaic cells (SCEx19-1 to SCEx19-8) were prepared using the photovoltaic cell substrates (SEx19-1 to SEx19-8) under the same conditions as in Example 1.

The results of reflectance of these cells which is normalized with SEx19-1 are set forth in Table 30.

TABLE 30

| | AlMg film thickness (μm) | Reflectance |
| --- | --- | --- |
| SEx19-1 | 0.01 | 1 |
| SEx19-2 | 0.015 | 1.8 |
| SEx19-3 | 0.020 | 1.8 |
| SEx19-4 | 0.10 | 1.9 |
| SEx19-5 | 0.50 | 1.9 |
| SEx19-6 | 1.0 | 1.9 |
| SEx19-7 | 1.5 | 1.9 |
| SEx19-8 | 2.0 | 1.9 |

The results of the bending adhesion test for environmental resistance are set forth in Table 31.

TABLE 31

| | AlMg film thickness (μm) | Peeling |
| --- | --- | --- |
| SEx19-1 | 0.01 | Not observed |
| SEx19-2 | 0.015 | Not observed |
| SEx19-3 | 0.020 | Not observed |
| SEx19-4 | 0.10 | Not observed |
| SEx19-5 | 0.50 | Not observed |
| SEx19-6 | 1.0 | Not observed |
| SEx19-7 | 1.5 | Not observed |
| SEx19-8 | 2.0 | Slightly observed |

Example 20

Figure 13:
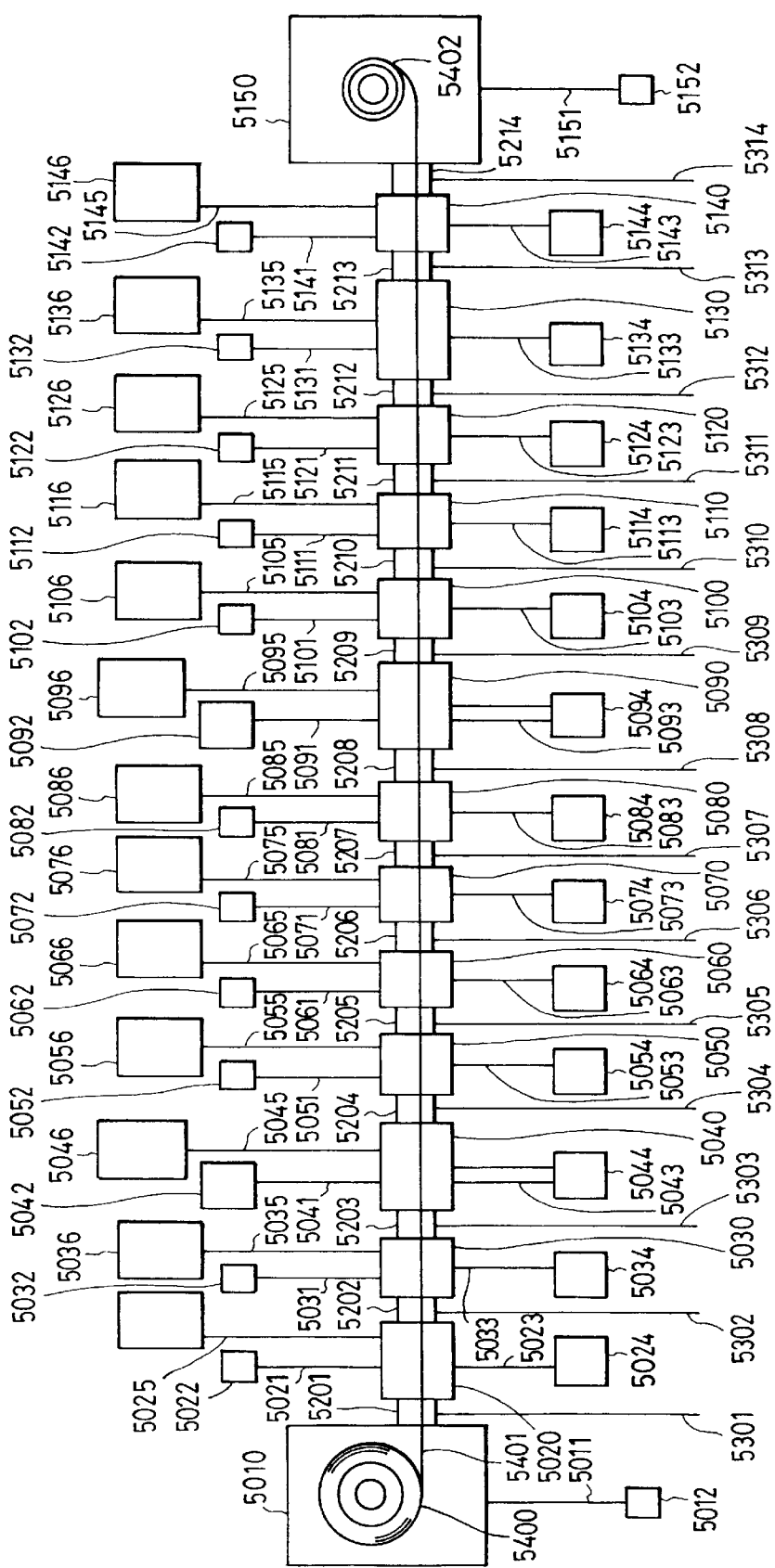
FIG. 13 is a block diagram of a roll-to-roll type photovoltaic cell fabricating apparatus in accordance with the present invention.
Figure 18:
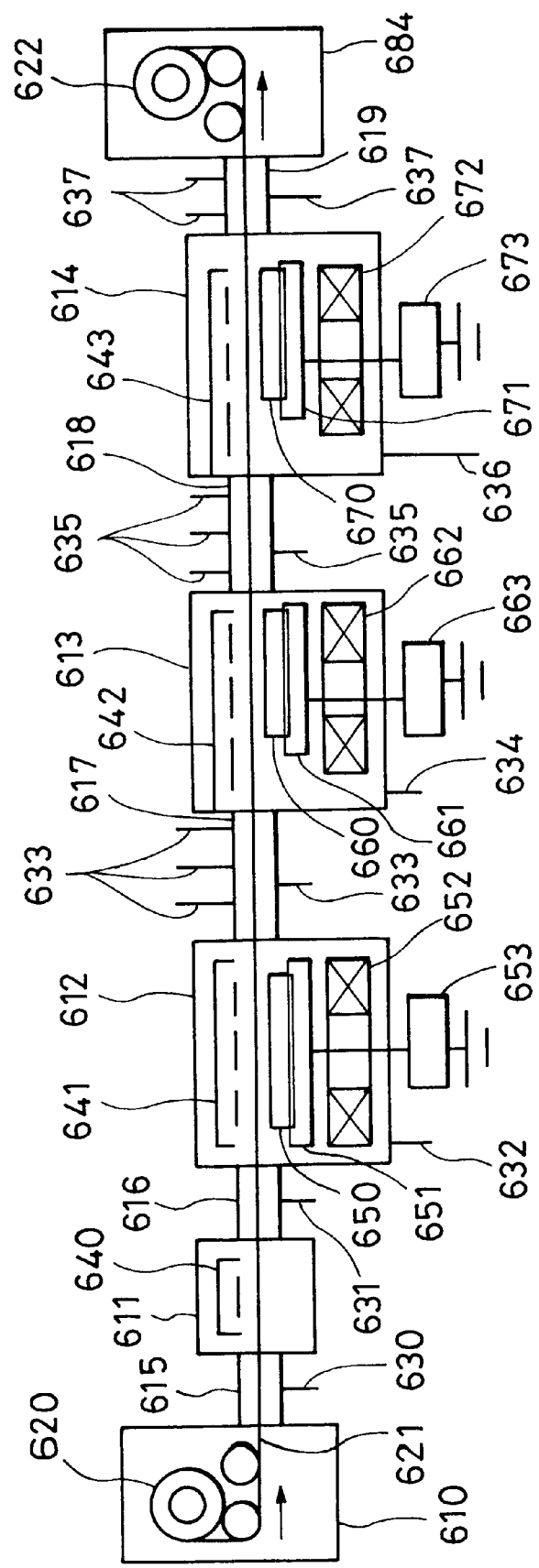
FIG. 18 is a block diagram of a roll-to-roll type magnetron sputtering system in accordance with the present invention.

A triple-type photovoltaic cell set forth in FIG. 15 was prepared using the roll-to-roll-type deposition systems set forth in FIGS. 13 and 18. A stainless steel strip having a length of 300 m, a width of 30 cm and a thickness of 0.2 mm was used as a substrate material.

The continuous substrate deposition system in accordance with the present invention set forth in FIG. 18 is provided with a substrate feeding chamber 601, a plurality of deposition chambers 611 through 614, and a substrate winding chamber 684 seriatim. These chambers are connected to each other through separating passages 615 through 619. The deposition chambers 611 through 614 are provided with exhaust vents for evacuation. A continuous sheet substrate 621 in the substrate feeding chamber 610 passes through deposition chambers 611 through 614 and separating passages 615 through 619 and is wound up in the substrate winding chamber 684. Given gases are supplied to the deposition chambers 611 through 614 and separating passages 615 through 619 from gas inlet pipes 630 through 632, 634 and 636 and exhausted to exhaust vents during layer deposition.

The substrate heating chamber 611 is provided to heat the substrate 621 to a given temperature. The interlayer deposition chamber 612 deposits a Ni interlayer on the substrate 621, the metal layer deposition chamber 613 deposits a metal layer of AlMg (90:10) thereon, and the transparent conductive layer deposition chamber 614 deposits a ZnO transparent conductive layer thereon. The deposition chambers are provided with halogen lamp substrate heaters 640 through 643 therein to heat them to given temperatures. The separating passages 617 through 619 have a cooling function.

The Ni interlayer is deposited in the interlayer deposition chamber 612 by DC magnetron sputtering using a Ni target 650 while introducing Ar gas and Ar/$N_2$ gas through the gas inlet pipe 632.

The metal layer is deposited in the metal layer deposition chamber 613 by DC magnetron sputtering using an AlMg (90:10) target 660 while introducing Ar gas through the gas inlet pipe 634.

The transparent conductive layer is deposited in the transparent deposition chamber 614 by DC or RF magnetron sputtering using a ZnO target 670 while introducing Ar gas through the gas inlet pipe 636.

(frequency: 2.45 GH) to each deposition chamber to generate plasma.

A photovoltaic cell substrate was formed on the 100 m sheet substrate in such a manner.

TABLE 33

| (SC Ex.-20) | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Pressure Torr | MW power W/cm$^3$ | RF power W/cm$^3$ | Substrate temp. °C. | Thickness nm |
|---|---|---|---|---|---|---|---|---|---|---|---|---|---|
| RF n-type layer | 2.0 | | | | 100 | 220 | | | 1.3 | | 0.05 | 350 | 20 |
| RF i-type layer | | 4.0 | | | 100 | | | | 0.8 | | 0.008 | 300 | 10 |
| MW i-type layer | 68 | | | 69 | 250 | | | | 0.005 | 0.08 | 0.28 | 380 | 100 |
| RF i-type layer | | 4.0 | | | 100 | | | | 0.55 | | 0.008 | 300 | 23 |
| RF p-type layer | | | 0.1 | | 80 | | 9 | 2 | 1.8 | | 0.07 | 300 | 10 |
| RF n-type layer | 1.1 | | | | 40 | 290 | | | 1.1 | | 0.04 | 300 | 10 |
| RF i-type layer | | 4.0 | | | 90 | | | | 0.75 | | 0.008 | 300 | 10 |
| MW i-type layer | 53 | | | 49 | 250 | | | | 0.005 | 0.06 | 0.28 | 360 | 98 |
| RF i-type layer | | 3.5 | | | 90 | | | | 0.5 | | 0.008 | 280 | 23 |
| RF p-type layer | | | 0.2 | | 80 | | 9 | 2 | 1.7 | | 0.07 | 260 | 10 |
| RF n-type layer | 0.8 | | | | 50 | 250 | | | 1.05 | | 0.04 | 230 | 10 |
| RF i-type layer | | 7.0 | | | 80 | | | | 0.7 | | 0.007 | 190 | 90 |
| RF p-type layer | | | 0.4 | | 90 | | 8 | 2 | 1.6 | | 0.07 | 170 | 10 |

A photovoltaic cell substrate was formed under conditions set forth in Table 32 and wound up in the substrate winding chamber 684.

TABLE 32

| | Interlayer Ni | Metal layer AlMg (90:10) | Transparent conductive layer ZnO |
|---|---|---|---|
| Heating rate (° C./s) | 20 | 15 | 15 |
| Substrate temperature (° C.) | 260 | 280 | 300 |
| Ar gas flow rate (sccm) | 40 (1% N$_2$ = 4) | 30 | 35 |
| Pressure (mTorr) | 3 | 3 | 4 |
| Target | Ni | AlMg (90:10) | ZnO |
| Type of sputtering | DC | DC | DC |
| Sputtering Voltage (V) | 370 | 380 | 385 |
| Film thickness (μm) | 0.05 | 0.5 | 1.0 |
| Cooling gas | He | H$_2$ | He |
| Cooling rate (° C./s) | 10 | 10 | 15 |

Then, a photovoltaic cell was produced with a roll-to-roll type deposition system set forth in FIG. 13 under conditions set forth in Table 33.

The sheet photovoltaic cell substrate 5400 was placed in a load-lock chamber 5010, drawn to an unload-lock chamber 5150 through all the deposition chambers and gas gates and fixed to a winding reel in the unload-lock chamber 5150.

These deposition chambers were evacuated to 10$^{-3}$ Torr or less with evacuating systems (not shown in the drawing). A given material gas was supplied to each deposition chamber through its respective mixing unit 5024, 5034, 5044, 5054, 5064, 5074, 5084, 5094, 5104, 5114, 5124, 5134 or 5144. A given gas was supplied to each of gas gates 5210 through 5214 from their respective gate gas supplying unit.

The substrate was heated with a substrate heater provided in each deposition chamber, and the degree of vacuum of each chamber was adjusted with its respective exhausting valve. After the substrate temperature and chamber pressure were stabilized, the sheet substrate was transferred, while supplying RF electric power or MW electric power An ITO transparent electrode 212 having a thickness of 70 nm was deposited on the RFp-type layer 211 by a vacuum evaporation process. Then, a mask with a comb-type opening was placed on the transparent electrode 212, and a comb-type collective electrode 213 composed of Cr (40 nm)/Ag (1,000 nm)/Cr (40 nm) was deposited thereon by a vacuum evaporation process. A photovoltaic cell substrate was prepared in such a manner. Eight cut pieces (SCEx20-1 through SCEx20-8) having a length of 300 m and a width of 30 cm were extracted from the resulting photovoltaic cell substrate in a rate of two pieces per 100 m.

Comparative Example 5

Eight photovoltaic cells (SCCE5-1 through SCCE5-8) were prepared as in Example 20, but a Ni interlayer was not formed, and an Ag metal layer was deposited instead of the AlMg metal layer.

These photovoltaic cells (SCEx20-1 through SCEx20-8 and SCCE5-1 through SCCE5-8) were irradiated with light of AM1.5 (100 mW/cm$^2$) and were subjected to evaluation of fluctuation in I–V characteristics. Results which were normalized with their respective minimum conversion efficiencies (SCEx20-4 and SCCE5-5) are set forth in Table 34.

TABLE 34

| Sampling site | SCEx20 | SCCE5 |
|---|---|---|
| No. 1 Length: 0, width: 10 | 1.01 | 1.05 |
| No. 2 Length: 0, width: 20 | 1.01 | 1.06 |
| No. 3 Length: 100, width: 10 | 1.02 | 1.03 |
| No. 4 Length: 100, width: 20 | 1 | 1.06 |
| No. 5 Length: 200, width: 10 | 1.03 | 1 |
| No. 6 Length: 200, width: 20 | 1.01 | 1.02 |
| No. 7 Length: 300, width: 10 | 1.00 | 1.08 |
| No. 8 Length: 300, width: 20 | 1.02 | 1.02 |

These results demonstrate that the prior art photovoltaic cells (SCCE5) have a ratio of 1.08 of the maximum conversion efficiency to the minimum conversion efficiency, whereas the photovoltaic cells (SCEx20) in accordance with the present invention have a ratio of 1.03 of the maximum conversion efficiency to the minimum conversion efficiency. Therefore, the photovoltaic cells (SCEx20) in accordance with the present invention exhibit uniform photovoltaic conversion characteristics.

Example 21

A photovoltaic cell substrate (SEx21) was prepared as in Example 1, except that an AlTi (Ti: 10 percent by weight) target was used, and an Al—Ti (90:10) metal layer 201 having a thickness of 0.3 µm was formed. A photovoltaic cell (SCEx21) was prepared using the photovoltaic cell substrate (SEx21) under the same conditions as in Example 1.

Comparative Example 6

A photovoltaic cell substrate (SCE6) and a photovoltaic cell (SCCE6) were prepared as in Example 21, but a Ni interlayer 299 was not formed, and an Ag metal layer 201 having a thickness of 0.3 µm was deposited by exchanging the target 331 for silver.

Results of the high temperature adhesion test demonstrate that the photovoltaic cell substrate (SEx21) in accordance with the present invention does not peel at all, whereas the prior art photovoltaic cell substrate (SCE6) partly peels. Therefore, the photovoltaic cell substrate (SEx21) in accordance with the present invention exhibits satisfactory results in the high temperature adhesion test.

Results of the reverse bias impression test at high temperature, and high humidity demonstrate that the minimum RshDk value of the photovoltaic cell (SCEx21) in accordance with the present invention is double of that of the prior art photovoltaic cell (SCCE6), and thus the photovoltaic cell (SCEx21) in accordance with the present invention has satisfactory results in the reverse bias impression test at high temperature and high humidity.

Results of the bending adhesion test for environmental resistance demonstrate that the photovoltaic cell (SCEx21) in accordance with the present invention does not peel at all, whereas the prior art photovoltaic cell (SCCE6) partly peels. Therefore, the photovoltaic cell (SCEx21) in accordance with the present invention exhibits satisfactory results in the bending adhesion test for environmental resistance.

These photovoltaic cells (SCEx21) and (SCCE6) were irradiated with light of AM1.5 (100 mW/cm$^2$) before and after the bending adhesion test for environmental resistance to determine changes in I–V characteristics during the bending adhesion test for environmental resistance. Results are set forth in Table 35.

TABLE 35

|  | SCEx21 | SCCE6 |
| --- | --- | --- |
| Conversion efficiency (after test/before test) | 1.00 | 0.82 |
| Curvilinear factor (after test/before test) | 1.00 | 0.88 |
| Series resistance (after test/before test) | 1.00 | 1.37 |

The results set forth in Table 35 demonstrate that the conversion efficiency, curvilinear factor and series resistance of the prior art photovoltaic cell (SCCE6) deteriorate during the bending adhesion test for environmental resistance, whereas those of the photovoltaic cell (SCEx21) in accordance with the present invention do not change. These results also illustrate that the photovoltaic cell (SCEx21) in accordance with the present invention has excellent durability to this test.

Example 22

A photovoltaic cell substrate (SEx22) was prepared as in Example 2, except that the thickness of the Cr interlayer 299 was 0.05 µm, and an Al—Ti (80:20) metal layer 201 having a thickness of 1.0 µm was formed using an AlTi (Ti: 20 percent by weight) target. A photovoltaic cell (SCEx22) was prepared using the photovoltaic cell substrate (SEx22) under the same conditions as in Example 2.

Comparative Example 7

A photovoltaic cell substrate (SCE7) and a photovoltaic cell (SCCE7) were prepared as in Example 22, but a Cr interlayer 299 was not formed, and an Ag metal layer 201 having a thickness of 1.0 µm was deposited by exchanging the target 331 for silver.

Results of the high temperature adhesion test demonstrate that the photovoltaic cell substrate (SEx22) in accordance with the present invention does not peel at all, whereas the prior art photovoltaic cell substrate (SCE7) partly peels. Therefore, the photovoltaic cell substrate (SEx22) in accordance with the present invention exhibits satisfactory results in the high temperature adhesion test.

Results of the reverse bias impression test at high temperature and high humidity demonstrate that the minimum RshDk value of the photovoltaic cell (SCEx22) in accordance with the present invention is 1.8 times that of the prior art photovoltaic cell (SCCE7), and thus the photovoltaic cell (SCEx22) in accordance with the present invention has satisfactory results in the reverse bias impression test at high temperature and high humidity.

Results of the bending adhesion test for environmental resistance demonstrate that the photovoltaic cell (SCEx22) in accordance with the present invention does not peel at all, whereas the prior art photovoltaic cell (SCCE7) partly peels. Therefore, the photovoltaic cell (SCEx22) in accordance with the present invention exhibits satisfactory results in the bending adhesion test for environmental resistance.

These photovoltaic cells (SCEx22) and (SCCE7) were irradiated with light of AM1.5 (100 mW/cm$^2$) before and after the bending adhesion test for environmental resistance to determine changes in I–V characteristics during the bending adhesion test for environmental resistance. Results are set forth in Table 36.

TABLE 36

|  | SCEx22 | SCCE7 |
| --- | --- | --- |
| Conversion efficiency (after test/before test) | 1.00 | 0.82 |
| Curvilinear factor (after test/before test) | 1.00 | 0.87 |
| Series resistance (after test/before test) | 1.00 | 1.38 |

The results set forth in Table 36 demonstrate that the conversion efficiency, curvilinear factor and series resistance of the prior art photovoltaic cell (SCCE7) deteriorate during the bending adhesion test for environmental resistance, whereas those of the photovoltaic cell (SCEx22) in accordance with the present invention do not change. These results also illustrate that the photovoltaic cell (SCEx22) in accordance with the present invention has excellent durability to this test.

Example 23

A photovoltaic cell substrate (SEx23) was prepared as in Example 3, except that the thickness of the Ti interlayer 299 was 0.5 µm, and an Al—Ti (70:30) metal layer 201 having a thickness of 0.7 µm was formed using an AlTi (Ti: 30 percent by weight) target. A photovoltaic cell (SCEx23) was prepared using the photovoltaic cell substrate (SEx23) under the same conditions as in Example 3.

Comparative Example 8

A photovoltaic cell substrate (SCE8) and a photovoltaic cell (SCCE8) were prepared as in Example 23, but a Ti interlayer 299 was not formed, and an Ag metal layer 201 having a thickness of 0.7 µm was deposited by exchanging the target 331 for silver.

Results of the high temperature adhesion test demonstrate that the photovoltaic cell substrate (SEx23) in accordance with the present invention does not peel at all whereas the prior art photovoltaic cell substrate (SCE8) partly peels. Therefore, the photovoltaic cell substrate (SEx23) in accordance with the present invention exhibits satisfactory results in the high temperature adhesion test.

Results of the reverse bias impression test at high temperature and high humidity demonstrate that the minimum RshDk value of the photovoltaic cell (SCEx23) in accordance with the present invention is 1.9 times that of the prior art photovoltaic cell (SCCE8), and thus the photovoltaic cell (SCEx23) in accordance with the present invention has satisfactory results in the reverse bias impression test at high temperature and high humidity.

Results of the bending adhesion test for environmental resistance demonstrate that the photovoltaic cell (SCEx23) in accordance with the present invention does not peel at all, whereas the prior art photovoltaic cell (SCCE8) partly peels. Therefore, the photovoltaic cell (SCEx23) in accordance with the present invention exhibits satisfactory results in the bending adhesion test for environmental resistance.

These photovoltaic cells (SCEx23) and (SCCE8) were irradiated with light of AM1.5 (100 mW/cm$^2$) before and after the bending adhesion test for environmental resistance to determine changes in I–V characteristics during the bending adhesion test for environmental resistance. Results are set forth in Table 37.

TABLE 37

|  | SCEx23 | SCCE8 |
|---|---|---|
| Conversion efficiency (after test/before test) | 1.00 | 0.86 |
| Curvilinear factor (after test/before test) | 1.00 | 0.89 |
| Series resistance (after test/before test) | 1.00 | 1.31 |

The results set forth in Table 37 demonstrate that the conversion efficiency, curvilinear factor and series resistance of the prior art photovoltaic cell (SCCE8) deteriorate during the bending adhesion test for environmental resistance, whereas those of the photovoltaic cell (SCEx23) in accordance with the present invention do not change. These results also illustrate that the photovoltaic cell (SCEx23) in accordance with the present invention has excellent durability to this test.

Example 24

A photovoltaic cell substrate (SEx24) was prepared as in Example 4, except that the thickness of the Ni—Cr (90:10) interlayer 299 was 0.1 µm, and an Al—Ti (85:15) metal layer 201 having a thickness of 0.3 µm was formed using an AlTi (Ti: 15 percent by weight) target. A photovoltaic cell (SCEx24) was prepared using the photovoltaic cell substrate (SEx24) under the same conditions as in Example 4.

Comparative Example 9

A photovoltaic cell substrate (SCE9) and a photovoltaic cell (SCCE9) were prepared as in Example 24, but a Ni—Cr interlayer 299 was not formed, and an Ag metal layer 201 having a thickness of 0.3 µm was deposited by exchanging the target 331 for silver.

Results of the high temperature adhesion test demonstrate that the photovoltaic cell substrate (SEx24) in accordance with the present invention does not peel at all, whereas the prior art photovoltaic cell substrate (SCE9) partly peels. Therefore, the photovoltaic cell substrate (SEx24) in accordance with the present invention exhibits satisfactory results in the high temperature adhesion test.

Results of the reverse bias impression test at high temperature and high humidity demonstrate that the minimum RshDk value of the photovoltaic cell (SCEx24) in accordance with the present invention is 1.8 times that of the prior art photovoltaic cell (SCCE9), and thus the photovoltaic cell (SCEx24) in accordance with the present invention has satisfactory results in the reverse bias impression test at high temperature and high humidity.

Results of the bending adhesion test for environmental resistance demonstrate that the photovoltaic cell (SCEx24) in accordance with the present invention does not peel at all, whereas the prior art photovoltaic cell (SCCE9) partly peels. Therefore, the photovoltaic cell (SCEx24) in accordance with the present invention exhibits satisfactory results in the bending adhesion test for environmental resistance.

These photovoltaic cells (SCEx24) and (SCCE9) were irradiated with light of AM1.5 (100 mW/cm$^2$) before and after the bending adhesion test for environmental resistance to determine changes in I–V characteristics during the bending adhesion test for environmental resistance. Results are set forth in Table 38.

TABLE 38

|  | SCEx24 | SCCE9 |
|---|---|---|
| Conversion efficiency (after test/before test) | 1.00 | 0.91 |
| Curvilinear factor (after test/before test) | 1.00 | 0.93 |
| Series resistance (after test/before test) | 1.00 | 1.18 |

The results set forth in Table 39 demonstrate that the conversion efficiency, curvilinear factor and series resistance of the prior art photovoltaic cell (SCCE9) deteriorate during the bending adhesion test for environmental resistance, whereas those of the photovoltaic cell (SCEx24) in accordance with the present invention do not change. These results also illustrate that the photovoltaic cell (SCEx24) in accordance with the present invention has excellent durability to this test.

Example 25

Photovoltaic cell substrates (SEx25-1 through SEx25-8) were prepared as in Example 21, except that their Al—Ti metal layers 201 had different Ti contents ranging from 0.1 percent by weight to 50 percent by weight. Photovoltaic cells (SCEx25-1 through SCEx25-8) were prepared using these photovoltaic cell substrates (SEx25-1 through SEx25-8) under the same conditions as in Example 21.

The results of the high temperature adhesion test are set forth in Table 39.

TABLE 39

| | Ti content (wt %) | Peeling |
|---|---|---|
| SEx25-1 | 0.1 | Slightly observed |
| SEx25-2 | 0.2 | Not observed |
| SEx25-3 | 0.5 | Not observed |
| SEx25-4 | 1 | Not observed |
| SEx25-5 | 10 | Not observed |
| SEx25-6 | 30 | Not observed |
| SEx25-7 | 40 | Not observed |
| SEx25-8 | 50 | Not observed |

The results of the bending adhesion test for environmental resistance are set forth in Table 40.

TABLE 40

| | Ti content (wt %) | Peeling |
|---|---|---|
| SEx25-1 | 0.1 | Not observed |
| SEx25-2 | 0.2 | Not observed |
| SEx25-3 | 0.5 | Not observed |
| SEx25-4 | 1 | Not observed |
| SEx25-5 | 10 | Not observed |
| SEx25-6 | 30 | Not observed |
| SEx25-7 | 40 | Not observed |
| SEx25-8 | 50 | Slightly observed |

Example 26

Photovoltaic cell substrates (SEx26-1 through SEx26-8) were prepared as in Example 21, except that their Al—Ti metal layers 201 had different thickness ranging from 0.01 μm to 2 μm. Photovoltaic cells (SCEx26-1 through SCEx26-8) were prepared using these photovoltaic cell substrates (SEx26-1 through SEx26-8) under the same conditions as in Example 21.

The results of reflectance of these cells which is normalized with SEx26-1 are set forth in Table 41.

TABLE 41

| | AlTi film thickness (μm) | Reflectance |
|---|---|---|
| SEx26-1 | 0.01 | 1 |
| SEx26-2 | 0.015 | 1.9 |
| SEx26-3 | 0.020 | 1.9 |
| SEx26-4 | 0.10 | 1.9 |
| SEx26-5 | 0.50 | 1.9 |
| SEx26-6 | 1.0 | 1.9 |
| SEx26-7 | 1.5 | 1.9 |
| SEx26-8 | 2.0 | 1.9 |

The results of the bending adhesion test for environmental resistance are set forth in Table 42.

TABLE 42

| | AlTi film thickness (μm) | Peeling |
|---|---|---|
| SEx26-1 | 0.1 | Not observed |
| SEx26-2 | 0.2 | Not observed |
| SEx26-3 | 0.5 | Not observed |
| SEx26-4 | 1 | Not observed |
| SEx26-5 | 10 | Not observed |
| SEx26-6 | 30 | Not observed |
| SEx26-7 | 40 | Not observed |
| SEx26-8 | 50 | Slightly observed |

Example 27

A pin-type a-Si photovoltaic cell having a cross-sectional structure set forth in FIG. 1 was produced. No interlayer was formed between the substrate 101 and the metal layer 102 in this example. An Al—Ti (Ti: 1 atomic percent) metal layer having a thickness of 700 Å was deposited on a stainless steel sheet using an Al—Ti alloy as in Experiment 1. A ZnO layer 103 having a thickness of 10,000 Å was deposited thereon using a ZnO target at a substrate temperature of 350° C. The resulting ZnO layer 103 had a textured surface.

Figure 11:
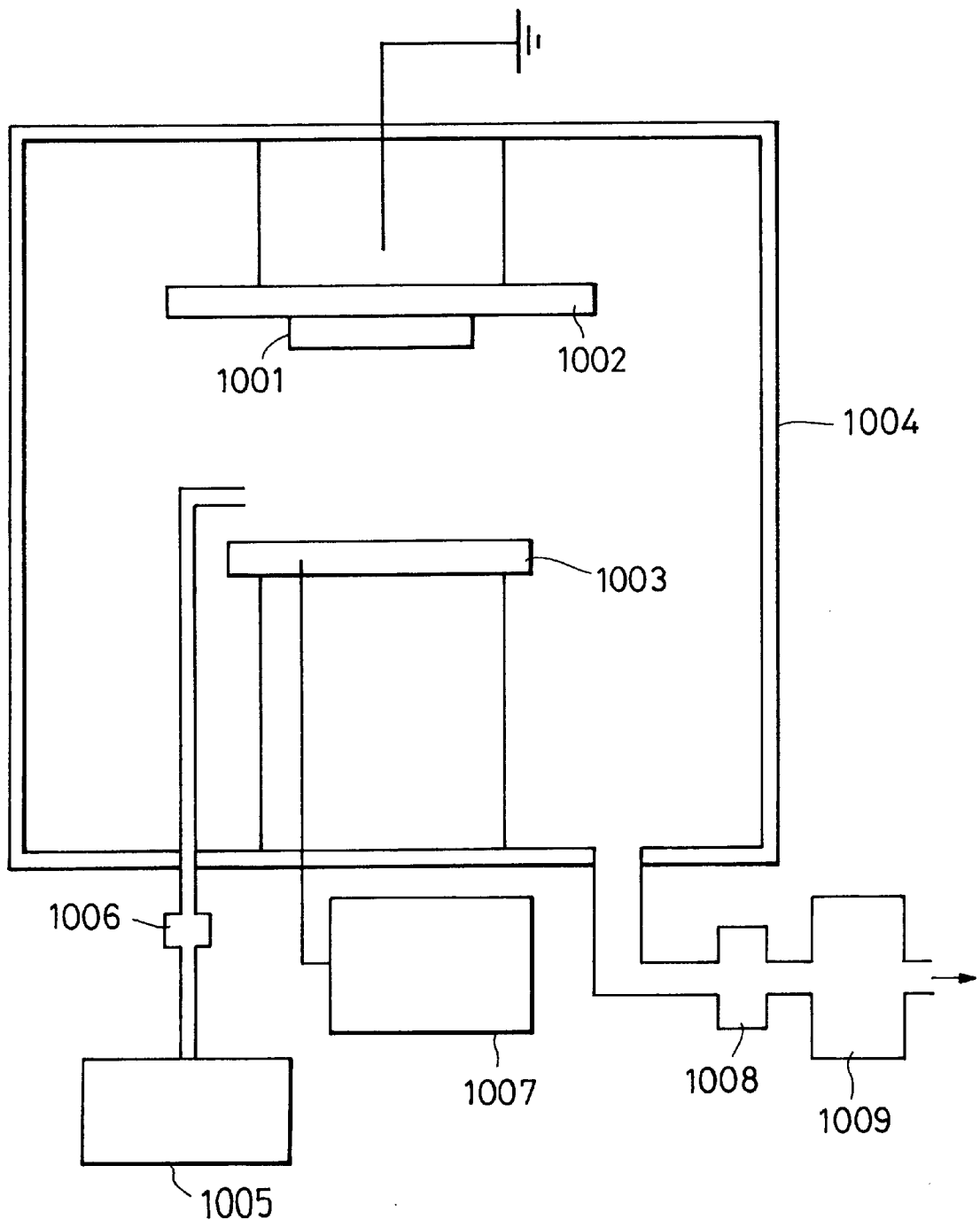
FIG. 11 is a schematic diagram of a capacitive coupled plasma CVD system in accordance with the present invention.

Next, a substrate 1001 with a back metal layer was placed into a commercially available capacity coupled plasma CVD system (CHJ-3030 made by ULVAC Japan Ltd.) set forth in FIG. 11. The reaction chamber was preliminarily evacuated with an evacuating pump 1009 through an exhausting pipe, and then evacuated to a high vacuum, while controlling the surface temperature of the substrate at 350° C. with a temperature controlling mechanism. After high vacuum evacuation, $SiH_4$ gas at 300 sccm, $SiF_4$ gas at 4 sccm, $PH_3/H_2$ (1% $PH_3$ in $H_2$) gas at 55 sccm and $H_2$ gas at 40 sccm were introduced through a gas supplying source 1005, while adjusting the reaction chamber pressure to 1 Torr with a throttle valve 1006. Immediately after the pressure was stabilized, 200 W electric power was applied with a RF electric power source 1007 to generate plasma. The plasma was maintained for 5 minutes. An n-type a-Si layer 105 was thereby deposited on a transparent conductive layer 103. After evacuating the reaction chamber again, $SiH_4$ gas at 300 sccm, $SiF_4$ gas at 4 sccm and $H_2$ gas at 40 sccm were introduced through the gas supplying source 1005, while adjusting the reaction chamber pressure to 1 Torr with the throttle valve 1006. Immediately after the pressure was stabilized, 150 W electric power was applied with the RF electric power source 1007 to generate plasma. The plasma was maintained for 60 minutes. An i-type a-Si layer 106 was thereby deposited on the n-type a-Si layer 105.

After evacuating the reaction chamber again, $SiH_4$ gas at 50 sccm, $BF_3/H_2$ (1% $BF_3$ in $H_2$) gas at 50 sccm and $H_2$ gas at 500 sccm were introduced through the gas supplying source 1005, while adjusting the reaction chamber pressure to 1 Torr with the throttle valve 1006. Immediately after the pressure was stabilized, 300 W electric power was applied with the RF electric power source 1007 to generate plasma. The plasma was maintained for 2 minutes. A p-type μc-Si layer 107 was thereby deposited on the i-type a-Si layer 106. After the resultant substrate was removed from the capacity coupled plasma CVD system, ITO was deposited thereon with a resistance heating evaporation system and an aqueous paste containing ferrous chloride was printed to form a given transparent electrode pattern 108. Further, an Ag paste was screen-printed to form a collective electrode 109. A thin film semiconductor solar cell was produced in such a manner.

Ten cells were produced in this process, and Jsc measurement was performed under light of AM-1.5. These solar cells exhibit an average current 6.1% higher than a solar cell having a pure Al metal layer. Further, decreased RshDk was not observed from a high temperature, high humidity reverse bias test of these solar cells according to Experiment 5.

TABLE 42-continued

| | AlTi film thickness (μm) | Peeling |
|---|---|---|
| SEx26-7 | 40 | Not observed |
| SEx26-8 | 50 | Slightly observed |

Example 28

Figure 12:
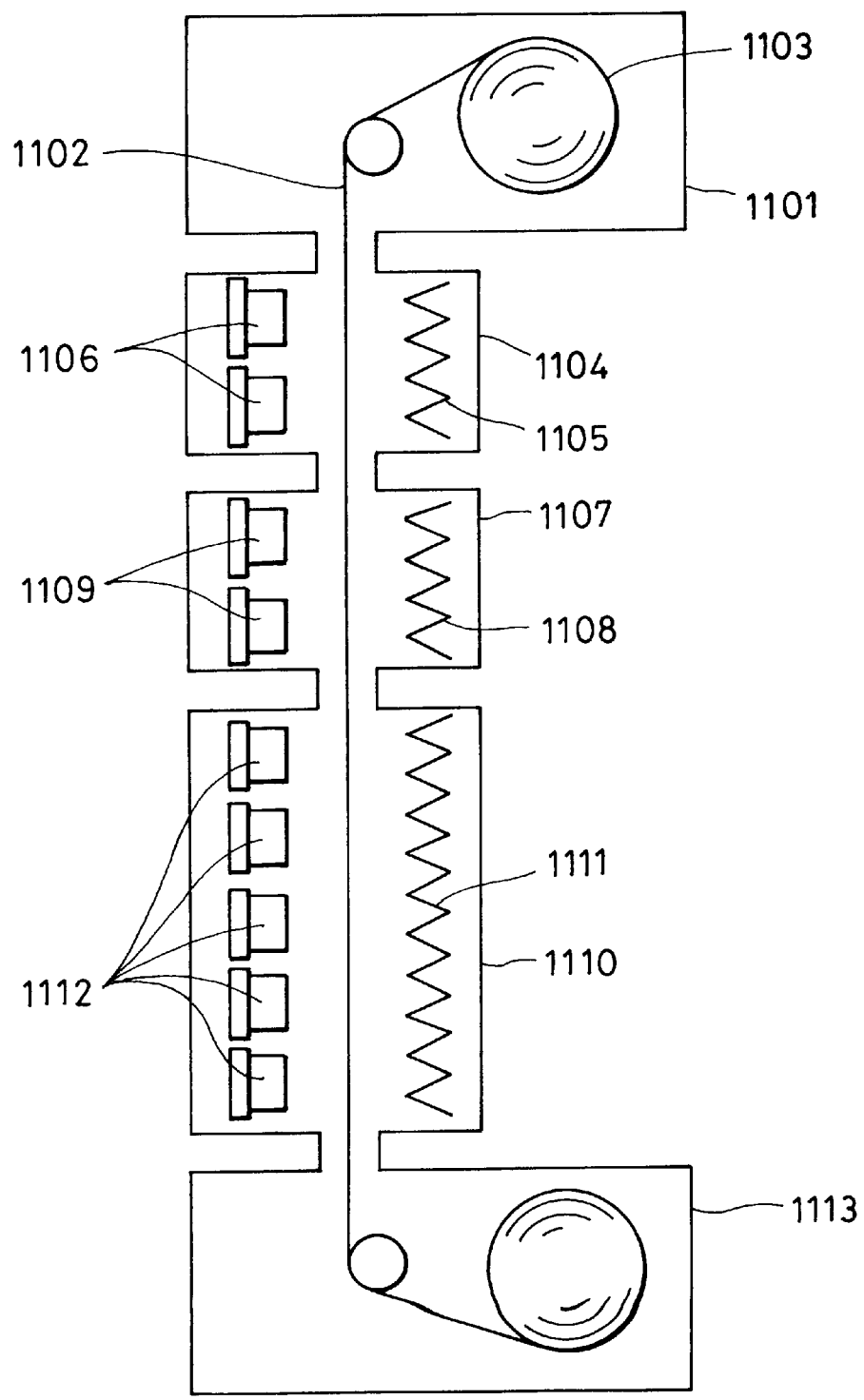
FIG. 12 is a schematic cross-sectional view of a continuous film deposition system in accordance with the present invention.

A back metal layer was continuously deposited on a long substrate with a deposition system set forth in FIG. 12. A stainless steel sheet roll 1103 which was previously washed having a width of 350 mm, a thickness of 0.2 mm and a length of 500 m was set in a substrate feeding chamber 1101. The stainless steel sheet 1102 was uncoiled and passed through to a winding chamber 1113 through metal layer deposition chambers 1104 and 1107 and a transparent conductive layer deposition chamber 1110. These deposition chambers are provided with substrate heaters 1105, 1108 and 1111 to heat the sheet substrate. An Al layer was deposited on the stainless steel sheet in the metal layer deposition chamber 1104 provided with an Al target 1106 having a purity of 99.99% by a magnetron sputtering process. An Al—Ag alloy (Ag:15 atomic percent) layer having a thickness of 1,000 Å was deposited thereon in the metal layer deposition chamber 1007 provided with an Al—Ag alloy target 1109 having a purity of 99.99% by a DC magnetron sputtering process; then a ZnO layer having a thickness of 10,000 Å was deposited thereon in the transparent conductive layer deposition chamber 1110 provided with a ZnO target 1112 having a purity of 99.99% by a DC magnetron sputtering process.

Figure 14:
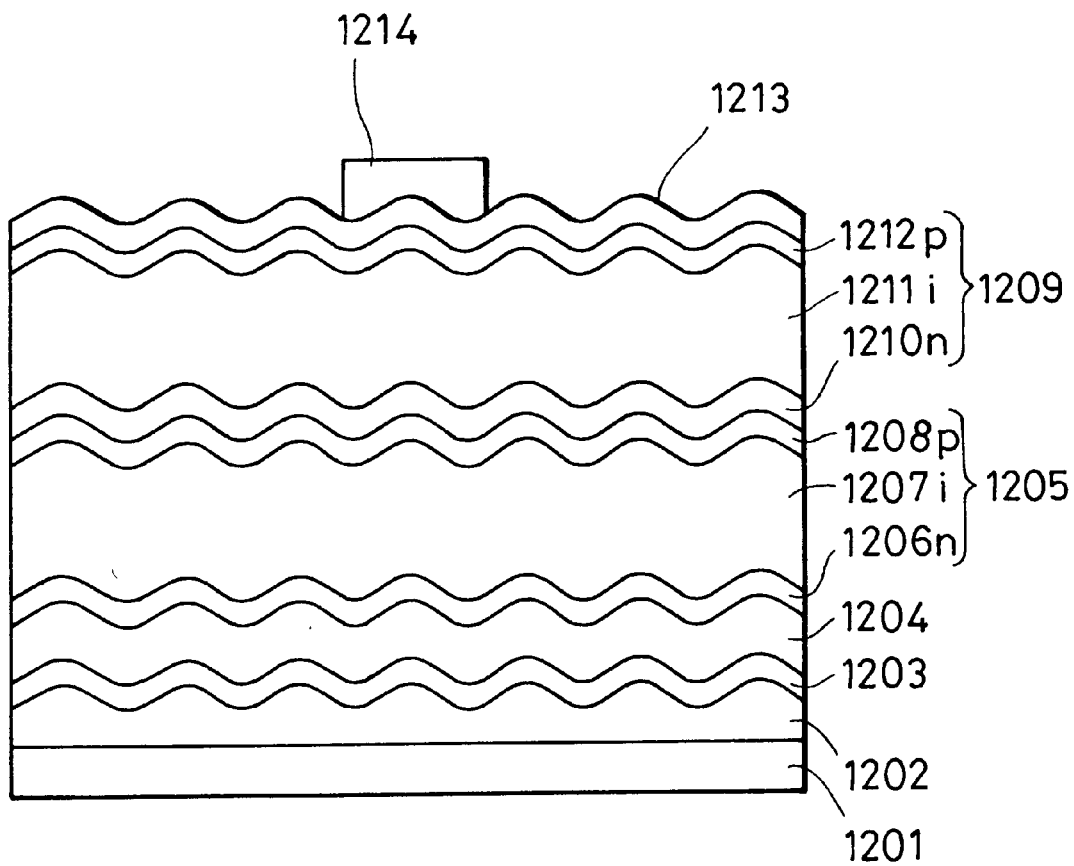
FIG. 14 is a schematic cross-sectional view of a tandem solar cell in accordance with the present invention.

An a-Si/a-SiGe tandem solar cell set forth in FIG. 14 was formed on the resulting substrate sheet. The tandem solar cell comprises a stainless steel substrate 1201, an Al layer 1202, an Al alloy layer 1203, a ZnO layer 1204, a bottom cell 1205 and a top cell 1209. The bottom cell 1205 comprises an n-type a-Si layer 1206, an i-type a-Si layer 1207 and a p-type μc-Si layer 1208, and the top cell 1209 comprises an n-type a-Si layer 1210, an i-type a-Si layer 1011 and a p-type μc-Si layer 1212. These thin semiconductor films were continuously deposited using a roll-to-roll-type deposition system disclosed in U.S. Pat. No. 4,492,181. The solar cell was provided with a transparent electrode 1213, which was formed with a sputtering system similar to that set forth in FIG. 12, and a collective electrode 1214. After patterning the transparent electrode and forming the collective electrode, the sheet 1102 was cut. The solar cell can be formed by an entire continuous production process with high efficiency.

Jsc measurement of 10 samples prepared in such a manner was performed under light of AM-1.5. These solar cells exhibit an average current 6% higher than a solar cell having a pure Al metal layer. Further, decreased RshDk was not observed from a high temperature, high humidity reverse bias test of these solar cells.

Example 29

A metal layer comprising an Al—Mg (Mg: 0.5 atomic percent) alloy and a transparent conductive layer were deposited on stainless steel which was produced as in Example 2, but treated so as to have a textured surface with a deposition system set forth in FIG. 12. The deposition chamber 1104 was not used for deposition of the metal layer, and an Al—Mg alloy was used as the target 1109 provided in the metallic deposition chamber 1107. Each layer was deposited as in Example 2. A photovoltaic cell substrate was formed with a roll-to-roll-type photovoltaic cell substrate forming system set forth in FIG. 13 under conditions set forth in Table 43.

A sheet substrate with a thickness of 35 cm was set in a load-lock chamber 5010. The sheet substrate was fixed to a winding reel in the unload-lock chamber 5050 through all deposition chambers and gas gates. Each deposition chamber was evacuated to $10^{-3}$ Torr or less with an evacuating system (not shown in the drawing). Hydrogen gas was supplied to the deposition chambers through mixing units 5024, 5034, 5044, 5054, 5064, 5074, 5084, 5094, 5104, 5114, 5124, 5134 and 5144 and to gas gates 5201, 5202, 5203, 5204, 5205, 5206, 5207, 5208, 5209, 5210, 5211, 5212, 5213 and 5214 through their respective gate gas supplying units. A distance for passing through the sheet substrate in each gas gate was set to 1 mm in this example, and a flow rate of hydrogen ($H_2$) gas was 1,000 sccm. The substrate was heated to a substrate temperature set forth in Table 43 with substrate heaters in the deposition chambers. When the substrate temperature was stabilized, hydrogen gas in the deposition chambers was exchanged for material gases set forth in Table 43. After completion of gas exchange, each deposition chamber was adjusted to a vacuum pressure set forth in table 43 with its corresponding exhaust valve. The sheet substrate was moved. After the vacuum pressure in each deposition chamber was stabilized, RF electric power and MW electric power set forth in Table 43 were supplied to each deposition chamber. An n layer was deposited in the deposition chamber 5020, an i layer (buffer layer) in the deposition chamber 5030, an i layer in the deposition chamber 5040, an i layer (buffer layer) in the deposition chamber 5050, a p layer in the deposition chamber 5060, an n layer in the deposition chamber 5070, an i layer (buffer layer) in the deposition chamber 5080, an i layer in the deposition chamber 5090, an i layer (buffer layer) in the deposition chamber 5100, a p layer in the deposition chamber 5110, an n layer in the deposition chamber 5120, an i layer in the deposition chamber 5130 and a p layer in the deposition chamber 5140. A photovoltaic cell having three stacked pin structures was formed on the sheet substrate over 100 m.

Jsc measurement of 100 samples prepared in such a manner was performed with a solar simulator AM-1.5. These solar cells exhibit an average current 5.8% higher than a solar cell having a pure Al metal layer. Further, satisfactory results were obtained from a high temperature, high humidity reverse bias test of these solar cells.

TABLE 43

| Bottom cell | |
|---|---|
| n-type layer | $SiH_4$: 10 sccm, $H_2$: 480 sccm, 1% $PH_3$ in $H_2$: 5 sccm<br>pressure: 1.3 Torr, RF power: 18 W,<br>substrate temperature: 380° C., thickness: 400 Å |
| RF-i layer | $SiH_4$: 80 sccm, $H_2$: 500 sccm<br>pressure: 0.5 Torr, RF power: 20 W,<br>substrate temperature: 270° C., thickness: 100 Å |
| MW-i layer | $SiH_4$: 160 sccm, $GeH_4$: 160 sccm, $SiH_2Cl_2$: 8 sccm,<br>$H_2$: 600 sccm, $B_2H_6$: 2.4 ppm<br>pressure: 7 mTorr, MW power: 440 W,<br>RF bias power: 1,000 W,<br>substrate temperature: 380° C., thickness: 700 Å |
| RF-i layer | $SiH_4$: 80 sccm, $H_2$: 500 sccm<br>pressure: 0.5 Torr, RF power: 20 W,<br>substrate temperature: 270° C., thickness: 200 Å |
| p-type layer | 10% $SiH_4$ in $H_2$: 2.5 sccm, $H_2$: 340 sccm,<br>2% $BF_3$ in $H_2$: 20 sccm<br>pressure: 2 Torr, RF power: 420 W,<br>substrate temperature: 200° C. |
| Middle cell | |
| n-type layer | $SiH_4$: 10 sccm, $H_2$: 480 sccm, 1% $PH_3$ in $H_2$: 10 sccm<br>pressure: 1.3 Torr, RF power: 18 W,<br>substrate temperature: 380° C., thickness: 400 Å |
| RF-i layer | $SiH_4$: 80 sccm, $H_2$: 500 sccm<br>pressure: 0.5 Torr, RF power: 20 W,<br>substrate temperature: 270° C., thickness: 100 Å |

TABLE 43-continued

| | |
|---|---|
| MW-i layer | SiH$_4$: 160 sccm, GeH$_4$: 160 sccm, SiH$_2$Cl$_2$: 8 sccm, H$_2$: 600 sccm, B$_2$H$_6$: 2.4 ppm pressure: 7 mTorr, MW power: 440 W, RF bias power: 1,000 W, substrate temperature: 380° C., thickness: 500 Å |
| RF-i layer | SiH$_4$: 80 sccm, H$_2$: 500 sccm pressure: 0.5 Torr, RF power: 20 W, substrate temperature: 270° C., thickness: 200 Å |
| p-type layer | 10% SiH$_4$ in H$_2$: 2.5 sccm, H$_2$: 340 sccm, 2% BF$_3$ in H$_2$: 20 sccm pressure: 2 Torr, RF power: 420 W, substrate temperature: 200° C. |
| Top cell | |
| n-type layer | SiH$_4$: 1 = sccm, H$_2$: 48 sccm, 1% PH$_3$ in H$_2$: 1 sccm pressure: 1.3 Torr, RF power: 18 W, substrate temperature: 380° C., thickness: 100 Å |
| RF-i layer | SiH$_4$: 40 sccm, H$_2$: 500 sccm pressure: 0.5 Torr, RF power: 20 W, substrate temperature: 250° C., thickness: 1,000 Å |
| p-type layer | 10% SiH$_4$ in H$_2$: 2.5 sccm, H$_2$: 340 sccm, 2% BF$_3$ in H$_2$: 20 sccm pressure: 2 Torr, RF power: 420 W, substrate temperature: 200° C. |
| Transparent electrode | In$_2$O$_3$ of 700 Å thickness deposited by a reactive evaporation process |
| Collective electrode | formed with an Ag paste |

As set forth above, in a back metal layer in accordance with the present invention, decrease in reflectance at near 830 nm inherent in aluminum is improved without deteriorating excellent migration resistance characteristics. Therefore, the resulting photovoltaic cell is highly reliable and has a high conversion efficiency. Since the back metal layer is mainly composed of inexpensive aluminum, low cost mass production of the photovoltaic cell can be achieved.

In particular, an Al—Mg alloy metal layer exhibits excellent adhesion to the substrate in a high-temperature, high-humidity environment, and a high chloride environment. An Al—Ti alloy metal layer exhibits excellent adhesion to the substrate in a high-temperature, high-humidity environment and a hot temperature environment, and satisfactory durability for long term use.

An interlayer, particularly comprising a metal or an alloy of nickel, chromium or titanium which contains at least one element selected from C, O and N, provided between the substrate and metal layer improves adhesion between the substrate and the interlayer and between the metal layer and interlayer.

Also, an interlayer, particularly comprising a metal or an alloy of nickel, chromium or titanium which contains at least one element selected from C, O and N, provided between the substrate and metal layer decreases strain and stress in the substrate, the metal layer and a buffer layer when a transparent conductive layer is provided.

Therefore, little peeling occurs in a bending adhesion test after the photovoltaic cell was placed into a high-temperature, high-humidity environment or sea water. Further, electromigration does not occur during a high temperature deterioration test. As a result, the photovoltaic cell in accordance with the present invention exhibits a stable and high conversion efficiency due to high durability to various environments.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are thereof intended to be embraced therein.

What is claimed is:

1. A photovoltaic cell comprising at least a metal layer, a semiconductive layer and a transparent electrode formed on a substrate, characterized in that said metal layer comprises a metal containing aluminum and titanium, wherein the titanium content is 5 atomic percent or less, or aluminum and magnesium, wherein the magnesium content is 5 atomic percent or less, or aluminum and silver, wherein the silver content is 25 atomic percent or less, and has an x-ray diffraction pattern in which a (111) peak intensity is at least 2.1 times a (200) peak intensity, at least 4.4 times a (220) peak intensity and at least 4.1 times a (311) peak intensity.

2. A photovoltaic cell according to claim 1, wherein an aluminum layer is provided between the said metal layer and said substrate.

3. A photovoltaic cell according to claim 1, wherein said metal layer has an uneven surface.

4. A photovoltaic cell according to claim 1, wherein said substrate comprises a metallic sheet.

5. A photovoltaic cell according to claim 1, wherein said substrate has an uneven surface.

6. A photovoltaic cell according to claim 1, wherein said substrate is a coiled sheet.

7. A photovoltaic cell according to claim 1, wherein a transparent conductive layer is provided between said metal layer and said semiconductive layer.

8. A photovoltaic cell according to claim 7, wherein said transparent conductive layer has an uneven surface.

9. A photovoltaic cell according to claim 1, wherein said semiconductive layer comprises a non-single-crystal semiconductor.

10. A photovoltaic cell according to claim 1, wherein said semiconductive layer comprises a plurality of semiconductor junctions.

11. A photovoltaic cell comprising at least a metal layer, a semiconductive layer and a transparent electrode formed on a substrate, said metal layer comprising an aluminum-titanium alloy having a titanium content ranging from 0.2 to 40 percent by weight or an aluminum-magnesium alloy having a magnesium content ranging from 0.5 to 40 percent by weight.

12. A photovoltaic cell according to claim 11, wherein said metal layer has a thickness ranging from 0.015 μm to 1.5 μm.

13. A photovoltaic cell according to claim 11, wherein an interlayer comprising nickel, chromium or titanium is provided between said substrate and said metal layer.

14. A photovoltaic cell according to claim 13, wherein said interlayer contains at least one element selected from the group consisting of carbon, oxygen and nitrogen.

15. A photovoltaic cell according to claim 14, wherein said at least one element selected from the group consisting of carbon, oxygen and nitrogen is contained in an amount of 10 ppm to 10,000 ppm.

16. A photovoltaic cell according to claim 13, wherein said interlayer has a thickness ranging from 0.03 μm to 2.0 μm.

* * * * *

UNITED STATES PATENT AND TRADEMARK OFFICE
CERTIFICATE OF CORRECTION

PATENT NO. : 6,172,296 B1
DATED : January 9, 2001
INVENTOR(S) : Yukiko Iwasaki et al.

It is certified that error appears in the above-identified patent and that said Letters Patent is hereby corrected as shown below:

Title page,
Item [56], References Cited, U.S. PATENT DOCUMENTS,
"Czubatuj et al." should read -- Czubatyj et al. --.
Item [57], line 4, "aluminum;" should read -- aluminum --.

Column 2,
Line 57, "submodules" should read -- submodule --.

Column 4,
Line 20, "a block diagram" should read -- block diagrams --.

Column 7,
Line 19, "5d Ag)," should read -- 5d(containing Ag), --;
Line 47, "RshDk $\leqq$ 10 k$\Omega$cm$^2$." should read -- RshDk $\geqq$ 10 k$\Omega$cm$^2$. --.

Column 13,
Line 32, "Si2H6" should read -- $Si_2H_6$ --.

Column 14,
Line 33, "formed" should read -- formed, --.

Column 19,
Line 41, "SEx5-8)" should read -- SCEx5-8) --.

Column 21,
Line 1, "is" should read -- are --.

Column 23,
Line 42, "is" should read -- are --.

UNITED STATES PATENT AND TRADEMARK OFFICE
CERTIFICATE OF CORRECTION

PATENT NO. : 6,172,296 B1
DATED : January 9, 2001
INVENTOR(S) : Yukiko Iwasaki et al.

It is certified that error appears in the above-identified patent and that said Letters Patent is hereby corrected as shown below:

Column 24,
Line 66, "is" should read -- are --.

Column 33,
Line 15, "all" should read -- all, --

Signed and Sealed this

Twenty-third Day of April, 2002

Attest:

JAMES E. ROGAN
*Director of the United States Patent and Trademark Office*

*Attesting Officer*